US008363853B2

(12) United States Patent
Bharitkar et al.

(10) Patent No.: US 8,363,853 B2
(45) Date of Patent: Jan. 29, 2013

(54) ROOM ACOUSTIC RESPONSE MODELING AND EQUALIZATION WITH LINEAR PREDICTIVE CODING AND PARAMETRIC FILTERS

(75) Inventors: Sunil Bharitkar, Los Angeles, CA (US); Yun Zhang, Santa Ana, CA (US); Chris Kyriakakis, Altadena, CA (US)

(73) Assignee: Audyssey Laboratories, Inc., Los Angeles, CA (US)

( * ) Notice: Subject to any disclaimer, the term of this patent is extended or adjusted under 35 U.S.C. 154(b) by 1276 days.

(21) Appl. No.: 11/710,019

(22) Filed: Feb. 23, 2007

(65) Prior Publication Data

US 2008/0205667 A1 Aug. 28, 2008

(51) Int. Cl.
*H03G 5/00* (2006.01)

(52) U.S. Cl. .................... 381/103; 381/71.12; 381/94.1; 381/94.3; 381/98; 379/406.12; 379/406.13; 379/406.14

(58) Field of Classification Search .................... 381/66, 381/71.1–71.12, 92, 93, 94.1, 94.2, 94.3, 381/94.4, 94.7, 95, 98, 97, 100, 103, 5, 9, 381/61, 63, 56, 58, 71, 73.1, 30, 94, 106; 379/406.01–406.16; 375/344, 319, 331, 375/349, 350, 229, 232, 234

See application file for complete search history.

(56) References Cited

U.S. PATENT DOCUMENTS

| | | | | |
|---|---|---|---|---|
| 4,888,809 | A | 12/1989 | Knibbeler | |
| 5,572,443 | A | 11/1996 | Emoto et al. | |
| 5,815,580 | A | 9/1998 | Craven et al. | |
| 6,011,853 | A * | 1/2000 | Koski et al. | 381/56 |
| 6,064,770 | A | 5/2000 | Scarth et al. | |
| 6,650,776 | B2 | 11/2003 | Ihara et al. | |
| 2003/0112981 | A1 | 6/2003 | McWilliam et al. | |
| 2004/0146170 | A1 * | 7/2004 | Zint | 381/103 |
| 2005/0157891 | A1 * | 7/2005 | Johansen | 381/103 |
| 2005/0175193 | A1 * | 8/2005 | Karjalainen et al. | 381/103 |

OTHER PUBLICATIONS

Kumin, Daniel, Snell Acoustics RSC 1000 Room-Correction System, Audio, Nov. 1997, vol. 81, No. 11, pp. 96-102.

http://www.snellacoustics.com/RSC1000.htm. Snell Acoustics RCS 1000 Digital Room Correction System.

Hatziantoniou, Panaglotis. Results for Room Acustics Based on Smooth Respnses. Audio Group. Electrical and Computer Engineering Department, University of Patras.

S.J. Elliott, Multiple-Point Equalization in a Room Using Adaptive Digital Filters. Journal of Audio Engineering Society, Nov. 1989, vol. 37, pp. 899-907.

* cited by examiner

*Primary Examiner* — Vivian Chin
*Assistant Examiner* — Leshui Zhang
(74) *Attorney, Agent, or Firm* — Kenneth L. Green

(57) ABSTRACT

A method for determining coefficients of a family of cascaded second order Infinite Impulse Response (IIR) parametric filters used for equalizing a room response. The method includes determining parameters of each IIR parametric filter from poles or roots of a reasonably high-order Linear Predictive Coding (LPC) model. The LPC model is able to accurately model the low-frequency room response modes providing better equalization of loudspeaker and room acoustics, particularly at the low frequencies. Advantages of the method include fast and efficient computation of the LPC model using a Levinson-Durbin recursion to solve the normal equations that arise from the least squares formulation. Due to possible band interactions between the cascaded IIR parametric filters, the method further includes optimizing the Q value of each filter to better equalize the room response.

15 Claims, 19 Drawing Sheets

ROOM ACOUSTIC RESPONSE MODELING AND EQUALIZATION WITH LINEAR PREDICTIVE CODING AND PARAMETRIC FILTERS

BACKGROUND OF THE INVENTION

The present invention relates to improving the performance of audio equipment and in particular to adapting equalization to a speaker and room combination.

Low frequency room acoustic response modeling and equalization is a challenging problem. Traditionally, Infinite-duration Impulse Response (IIR) or Finite-duration Impulse Response (FIR) filters have been used for acoustic response modeling and equalization. The IIR filter, also called a parametric filter; has a bell-shaped magnitude response and is characterized by its center frequency $F_c$, the gain G at the center frequency, and a Q factor (which is inversely related to the bandwidth of the filter) and is easily implemented as a cascade for purposes of room response modeling and equalization.

Room response modeling, and hence equalization or correction, has traditionally been approached as an inverse filter problem, where the resulting equalization filter is the inverse of the room response (or the minimum phase part). Such response modeling is especially challenging at low frequencies where standing waves often cause significant variations in the frequency response at a listening position. Typical filter structures for realizable equalization filter design include IIR filters or warped FIR filters.

A typical room is an acoustic enclosure which may be modeled as a linear system. When a loudspeaker is placed in the room, the resulting time domain response is the convolution of the room linear response and the loudspeaker response, and is denoted as a loudspeaker-room impulse response h(n); $n\in\{O, 1, 2, \ldots\}$. The loudspeaker-room impulse response has an associated frequency response, $H(e^{jw})$, which is a function of frequency. Generally, $H(e^{jw})$ is also referred to as the Loudspeaker-Room Transfer Function (LRTF). In the frequency domain, the LRTF shows significant spectral peaks and dips in the human range of hearing (i.e., 20 Hz to 20 kHz) in the magnitude response, causing audible sound degradation at a listener position. FIG. 1 shows an unsmoothed LRTF plot and a ⅓-octave smoothed LRTF plot of the loudspeaker-room response. As is evident from the smoothed LRTF plot, the loudspeaker-room response exhibits a large gain of about 10 dB at 75 Hz with a peak region about an octave wide at the 3 dB down point which results in unwanted amplification of sound in the peak region. A notch region at about 145 Hz is half-octave wide and attenuates sound in the notch region. Additional variations throughout the frequency range of hearing (20 Hz-20 kHZ), and a non-smooth and non-flat envelope of the response, will result in a poor sound reproduction from the loudspeaker in the room where these measurements were made. The objective of equalization is to correct the response variations in the frequency domain (i.e., minimize the deviations in the magnitude response) and ideally also minimize the energy of the reflections in the time domain.

Known methods of equalization include modeling the room responses (either via time domain or magnitude domain or jointly) and subsequently inverting the model to obtain an equalization filter. Unfortunately, traditional search based parametric filter design approaches (such as described in "Direct Method with Random Optimization for Parametric IIR Audio Equalization" by Ramos and Lopez, Proc. 116 AES Conv., Berlin May 2004) involve a search strategy which is susceptible to being stuck in a local minima, thereby effectively limiting the amount of correction at low frequencies.

BRIEF SUMMARY OF THE INVENTION

The present invention addresses the above and other needs by providing a frequency domain approach for modeling the low frequency magnitude response for equalization with a cascade of parametric IIR filters. Each of the cascaded parametric IIR filters may be described by filter parameters comprising the center frequency $F_c$, the gain G, and the bandwidth term Q (or quality factor). The filter parameters may be determined by first modeling the response using a high-order Linear Predictive Coding (LPC) model to capture the peaks and valleys in the magnitude response, especially at low frequencies, and then inverting the model. Parameters of the IIR parametric filters are then determined from the inverted model. As few as three to four cascaded parametric IIR filters may be used to achieve real-time room response equalization at low frequencies.

In accordance with one aspect of the invention, there is provided a method for equalizing audio signals. The method includes measuring loudspeaker-room acoustics to obtain time domain room response data and forming an equalization filter based on the time domain room response data. Steps in the method include processing the time domain room response data with a Linear Predictive Coding (LPC) model to obtain smoothed time domain room response data, computing parameters for a plurality of parametric Infinite-duration Impulse Response (IIR) filters from the smoothed time domain room response data, cascading the plurality of parametric IIR filters and forming an equalizing filter, and equalizing the loudspeaker-room response with the equalization filter.

In accordance with another aspect of the invention, there is provided a first method for computing parameters of cascaded parametric IIR filters. Unprocessed time domain room response data is collected. An FFT is performed on the time domain room response data to obtain a frequency domain room response. The frequency domain room response is normalized in a frequency range of interest to obtain a normalized frequency domain room response. An inverse FFT is performed on the normalized frequency domain room response to obtain normalized time domain room response data. The normalized time domain room response data is represented using an LPC model to obtain smoothed time domain room response data. An FFT is performed on the smoothed time domain room response data to obtain smoothed frequency domain room response data. The smoothed frequency domain room response data is inverted to obtain equalization frequency response. The magnitude of the equalization frequency response is computed. The peaks and valleys of the magnitude of the equalization frequency response are found. The gains, center frequencies, bandwidths and Q factors of each peak are computed. The gains and Qs are optimized. The parametric filter coefficients are then computed from the optimized gains and Qs.

In accordance with yet another aspect of the invention, there is provided a second method for computing parameters of cascaded parametric IIR filters. The second method includes collecting unprocessed time domain room response data. Performing an FFT on the time domain room response data to obtain a frequency domain room response. Normalizing the frequency domain room response in a frequency range of interest to obtain a normalized frequency domain room response. Performing an inverse FFT on the normalized frequency domain room response to obtain a normalized time domain room response data. Representing the normalized time domain room response data using an LPC model to obtain smoothed time domain room response data. Performing an FFT on the smoothed time domain room response data to obtain smoothed frequency domain room response data. Computing the magnitude of the smoothed frequency domain room response. Detecting peaks and valleys of the magnitude of the smoothed frequency domain room response. Computing gains, center frequencies, bandwidths and Q factors of each of the peaks. Optimizing the gains and the Q factors. Computing parametric filter coefficients from the optimized gains and the optimized Q factors. Determining poles and zeros of each of the parametric IIR filters based on the parametric filter coefficients. Computing minimum-phase zeroes from the zeros of each of the parametric filters. Reflecting each minimum-phase zero as a reflected pole and reflecting each pole as a reflected zero for each parametric filter. And expanding each reflected zero and its complex conjugate into a real second order numerator polynomial and expanding each reflected pole and its complex conjugate into a real second order denominator polynomial for each cascaded parametric filter.

In accordance with yet another aspect of the invention, there is provided a third method for computing parameters of cascaded parametric IIR filters. The third method includes collecting unprocessed time domain room response data. Performing an FFT on the time domain room response data to obtain a frequency domain room response. Normalizing the frequency domain room response in a frequency range of interest to obtain a normalized frequency domain room response. Performing an inverse FFT on the normalized frequency domain room response to obtain a normalized time domain room response data. Representing the normalized time domain room response data using an LPC model to obtain smoothed time domain room response data. Performing an FFT on the smoothed time domain room response data to obtain smoothed frequency domain room response data. Computing the magnitude of the smoothed frequency domain room response to obtain a magnitude response. Inverting the magnitude response. Detecting peaks and valleys of the inverted magnitude response. Computing gains, center frequencies, bandwidths and Q factors of each of the peaks. Optimizing the gains and the Q factors. And computing parametric filter coefficients from the optimized center frequencies, the optimized gains, and the optimized Q factors.

BRIEF DESCRIPTION OF THE SEVERAL VIEWS OF THE DRAWING

The above and other aspects, features and advantages of the present invention will be more apparent from the following more particular description thereof, presented in conjunction with the following drawings wherein.

Corresponding reference characters indicate corresponding components throughout the several views of the drawings.

DETAILED DESCRIPTION OF THE INVENTION

The following description is of the best mode presently contemplated for carrying out the invention. This description is not to be taken in a limiting sense, but is made merely for the purpose of describing one or more preferred embodiments of the invention. The scope of the invention should be determined with reference to the claims.

Low frequency room acoustic response modeling and equalization is a challenging problem. Traditionally, Infinite-duration Impulse Response (IIR) or Finite-duration Impulse Response (FIR) filters have been used for acoustic response modeling and equalization. The parametric IIR filter, also called a parametric filter, has a bell-shaped frequency domain magnitude response and is characterized by its center frequency $F_c$, gain G at the center frequency $F_c$, and a Q factor (which is inversely related to the bandwidth of the filter). Such an IIR filter is easily implemented as a cascade of lower order IIR filters for purposes of room response modeling and equalization.

The present invention includes a method for determining the coefficients of each of a family of cascaded second order IIR parametric filters using a high-order Linear Predictive Coding (LPC) model, where the poles (or roots) of the LPC model are used to obtain the parameters of the parametric IIR filters. The LPC model is used to solve the normal equations which arise from a least squares formulation, and a moderately high-order LPC model is able to accurately model the low-frequency room response modes. Due to the band interactions between the IIR filters which are cascaded to model the room response, the method includes optimizing the Q values to better characterize the room response. The LPC model allows for better equalization for correcting the loudspeaker and room acoustics, particularly at low frequencies. Advantages of the present method include fast computation of the IIR parametric filter parameters using the LPC model, because the LPC model may be efficiently computed using the Levinson-Durbin recursion to solve normal equations which arise from the least squares formulation, and because a moderately high-order LPC model is able to accurately model the low-frequency room response modes.

Multichannel audio is aimed at rendering spatial audio in an immersive and convincing manner to people involved in listening to music at home and in cars, viewing movies in home-theaters, movie-theaters, etc. Examples of multichannel audio formats include Philips/Sony's SACD (Super Audio CD) and the DVD-Audio format. Examples of movie formats include Dolby Digital 5.1 and DTS.

Figure 2:
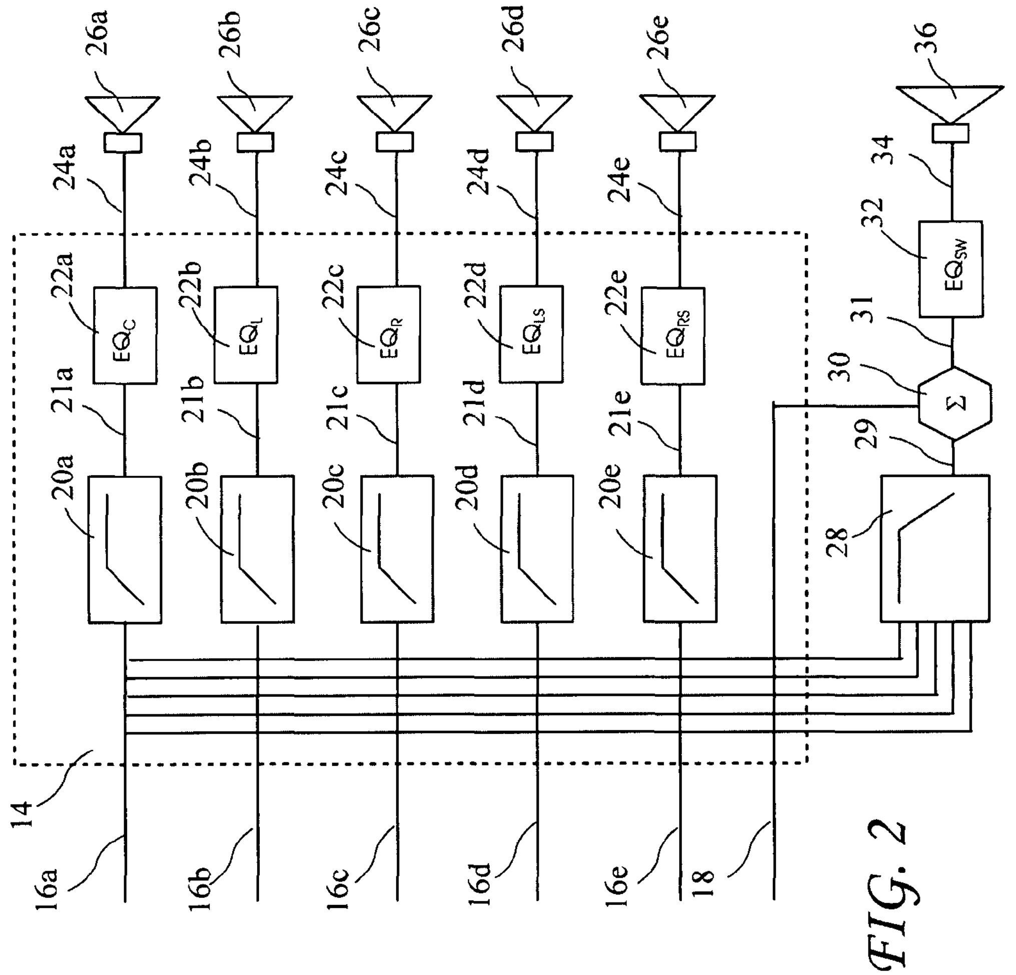
FIG. 2 depicts an audio system with equalization filters according to the present invention.

An example system level description of a 5.1 multi-channel audio system, with equalization filters in each channel for correcting loudspeaker-room acoustics, is shown in FIG. 2. The system includes bass management filters 20*a*-20*e* (high-pass) and 28 (low pass) and respective equalization filters 22*a*-22*e* and 32. The bass management filters 20*a*-20*e* process the incoming audio signals 16*a*-16*e* to generate filtered signal 21*a*-21*e* respectively, and the bass management filter 28 processes a combination of the audio signals 16*a*-16*e* to produce a filtered signal 29. The filtered signal 29 is summed with a bass audio signal 18 in a summer 30 to produce a summed signal 31. The filtered signals 21*a*-21*e* and the summed signal 31 are filtered by the filters 20*a*-20*e* and 28 so that the signals provided to the respective loudspeakers 26*a*-26*e* and 36 may produce sound without distortion. The Equalization filters 22*a*-22*e* and 32 process the filtered signals 21*a*-21*e* and the summed signal 31 respectively to provide equalized signals 24*a*-24*e* and 34 to the speakers 26*a*-26*e* and 36 respectively.

The equalization filters 22*a*-22*e* and 32 are obtained by measuring the loudspeaker-room response and determining the equalization filter parameters (center frequency "$F_c$", gain "G", and Q factor "Q") from the measured loudspeaker-room response using the LPC model. The resulting equalization filters 22*a*-22*e* and 32 do not change unless the multi-channel audio system is physically moved to another location in which case the loudspeaker room responses may need to be measured and new equalization filter parameters generated. Further, the loudspeaker-room responses vary with listening position and the method of the present invention may be adapted for multiple listener applications.

The equalization filters 22*a*-22*e* and 32 are preferably a set of cascaded second order parametric IIR filters and more preferably the equalization filters 22*a*-22*e* and 32 comprising as few as three or four cascaded second order parametric IIR filters. The second order parametric IIR filters are specified in terms of the Laplace transform, in terms of the center frequency $F_c$, gain G, and Q, as $$H_{f_C,Q,G}(s)=\frac{s^2+(2\pi f_c/Q_N)s+(2\pi f_c)^2}{s^2+(2\pi f_c/Q_D)s+(2\pi f_c)^2} \tag{1}$$

where, if G≧then $Q_D$=Q, and $Q_N=10^{|G|/20}$ Q. If G<0 then $Q_N$=Q, and $Q_D=10^{-|G|/20}$ Q In the digital domain, with a sampling frequency $f_s$, the equivalent transfer function may be expressed as:

$$H_{f_c,Q,G}(z)=\frac{b_o+b_1z-1+b_2z^{-2}}{1+a_1z^{-1}+a_2z^{-2}} \tag{2}$$

where, $$\begin{pmatrix}\frac{b_0\quad b_1\quad b_2}{1\quad a_1\quad a_2}\end{pmatrix}=\frac{1}{\beta_0}\begin{pmatrix}\frac{\alpha_0\quad \alpha_1\quad \alpha_2}{\beta_0\quad \beta_1\quad \beta_2}\end{pmatrix} \tag{3}$$

and the filter parameters are:

$$\alpha_0=4f_s^2+4\pi f_cf_s/Q_N+(2\pi f_c)^2$$

$$\alpha_1=-8f_s^2+2(2\pi f_c)^2$$

$$\alpha_2=4f_s^2-4\pi f_cf_s/Q_N$$

$$\beta_0=4f_s^2+4\pi f_cf_sQ_D+(2\pi f_c)^2$$

$$\beta_1=-8f_s^2+2(2\pi f_c)^2$$

$$\beta_2=4f_s^2-4\pi f_cf_s/Q_D+(2\pi f_c)^2$$

Figure 3:
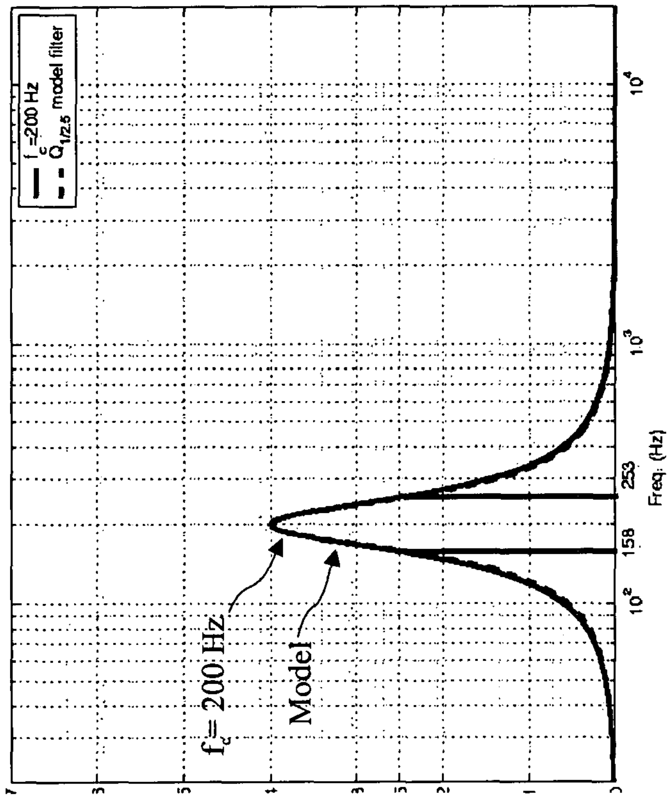
FIG. 3 shows an example of an IIR parametric filter.

FIG. 3 shows an example of a parametric IIR filter frequency response with G=4 dB, Q=2, and $f_c$=200 Hz, and a parametric IIR filter response obtained from (2) and (3) whose estimate of Q, $\hat{Q}$=2.1, was estimated from the bandwidth. The bandwidth BW here is based on the frequency separation at $1/\sqrt{2.5}$ of the gain G in dB. That is:

$$\hat{Q}=f_c/BW_{G/\sqrt{2.5}}(f_c)$$

For example, if:

$$BW=_{4/\sqrt{2.5}}(f_c)=253-158\text{ Hz}$$

then, $$Q=200/95=2.1$$

which is close to the true Q.

Figure 4:
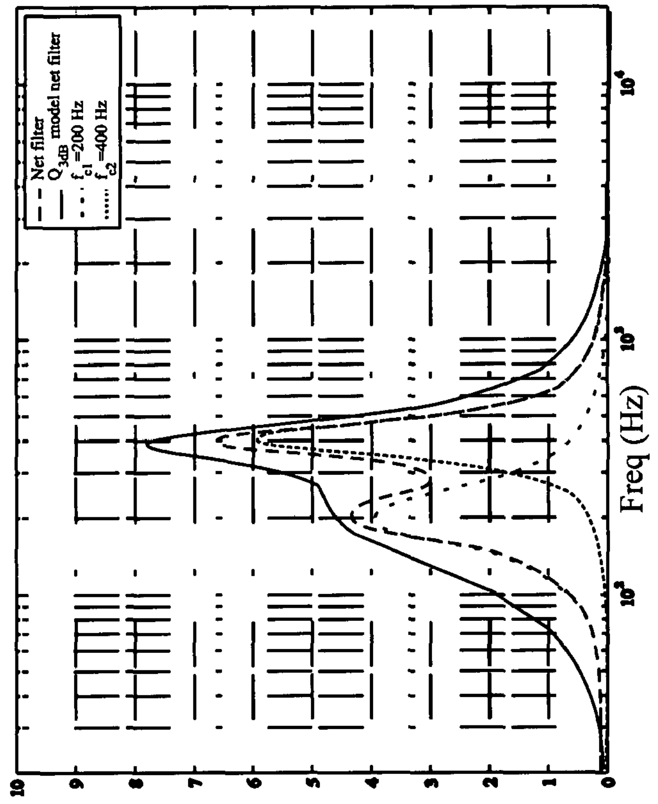
FIG. 4 is an IIR parametric filter used to model a response two peaks.
Figure 5:
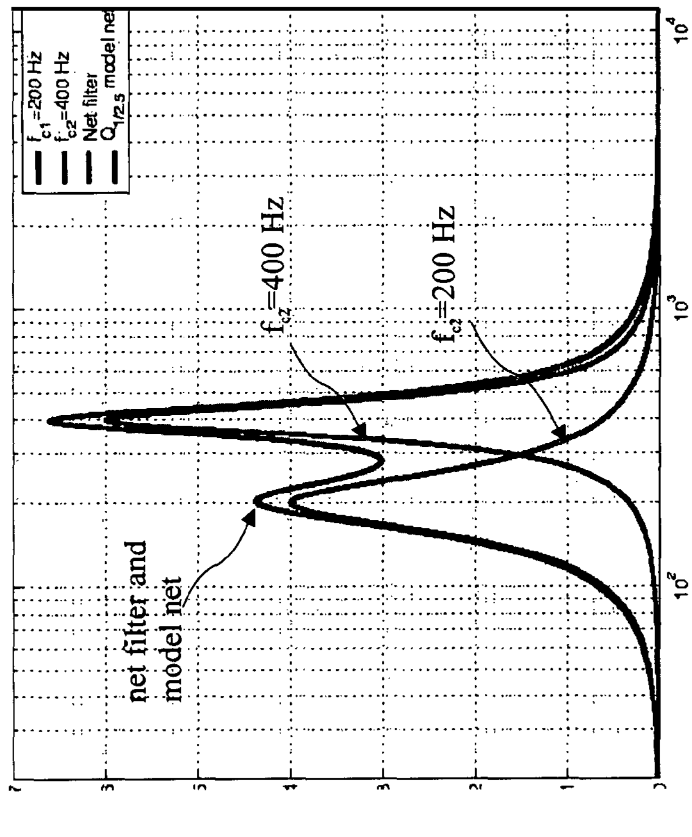
FIG. 5 is a second IIR parametric filter used to model a response two peaks.

The above described method for computing Q is preferred because $\hat{Q}$ based on other bandwidth criteria may yield inaccurate filters, and in effect, band interactions between a cascade of inaccurately Q-estimated parametric filters may lead to poor response modeling. This is shown in FIG. 4 where the bandwidth is determined from the frequency separation at a level which is 3 dB below the gain G (viz., G−3 dB). Clearly, the net filter obtained from the G-3 dB based Q estimation is significantly different than the filter obtained from the more accurate Q values used for designing the original parametric filters. FIG. 5 shows the result on using the $G/\sqrt{2.5}$ criteria, thereby confirming the accuracy of this Q estimation model.

Figure 1:
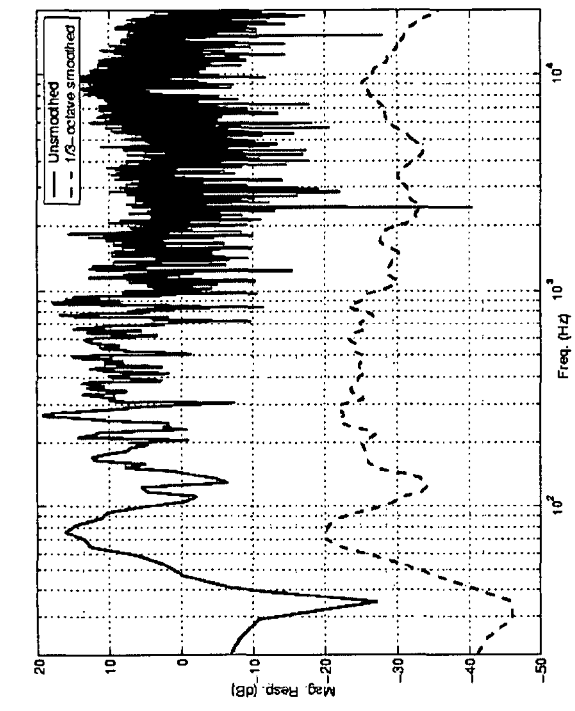
FIG. 1 includes graphs of the unsmoothed and smoothed loudspeaker room frequency response.

To model the important low-frequency magnitude response with parametric filters, it is required that the $F_c$, G and Q of each of the filters be estimated in a manner that the cascade of such parametric IIR filters yields a magnitude response with low error in the low-frequency region. Instead of performing an exhaustive search for maximas in the magnitude response, which can be computationally intensive and make the technique susceptible to local minimas, a sufficiently high-order all-pole model such as a Linear Predictive Coding (LPC) model may be used to track the dominant peaks in the magnitude response. Such LPC model is described in "Linear Prediction of Speech" authored by Markel and Gray and published by Springer-Verlag. The LPC is efficiently implemented using the Levinson-Durbin recursion, which is well known in the art. An LPC model of order 512 of the response in FIG. 1 is shown in FIG. 6 where emphasis is placed on modeling the response below 400 Hz.

Because the LPC model is characterized by an all-pole transfer function with denominator polynomial of order 512 in this example, it is necessary to find the frequency locations of the peaks using a root finding technique. The frequency locations of the peaks then yield the center frequency for the corresponding parametric IIR filters. A computationally efficient and accurate rootfinding technique for finding roots of high-order polynomials, is described in "Factoring Very-High Degree Polynomials" by Sutton and Burrus and published in the IEEE Signal Processing Magazine pages 27-43, November 2003. Thus, the root-finding method, such as described by Sutton, yields the poles of the LPC transfer function. That is, $$H(z) = \frac{A}{1 + \sum_{k=1}^{P-1} a_k z^{-k}} \quad \text{and,}$$

$$H(z) = \frac{A}{\prod_{k=1}^{P-1} (z - z_k)} \tag{4}$$

Figure 6:
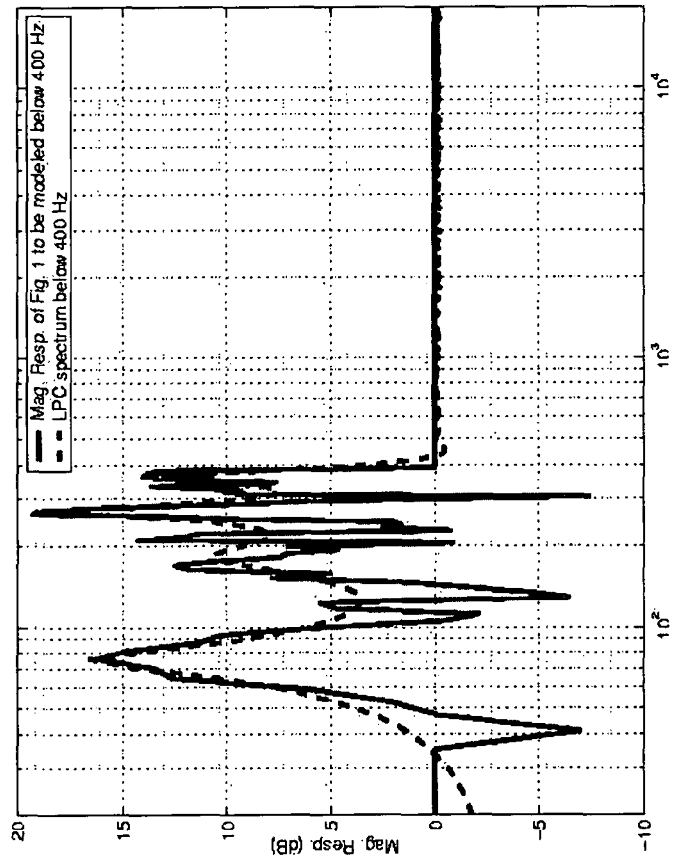
FIG. 6 is magnitude response below 400 Hz using an LPC of order 512.

The angle, $\theta_k$ of the poles $Z_k = r_k e^{j\theta k}$ yields the center frequencies associated with the LPC spectrum of FIG. 6. In this case, the center frequencies below 400 Hz, were $f_{c1}$=75 Hz, $f_{c2}$=181.14 Hz, $f_{c3}$=269 Hz, and $f_{c4}$=361.55 Hz which can be confirmed visually from the LPC peaks in FIG. 6. The center frequencies $f_{c1}$, $f_{c2}$, $f_{c3}$, and $f_{c4}$ form the corresponding center frequencies for the four parametric filters I=1, 2, 3, and 4.

Figure 8:
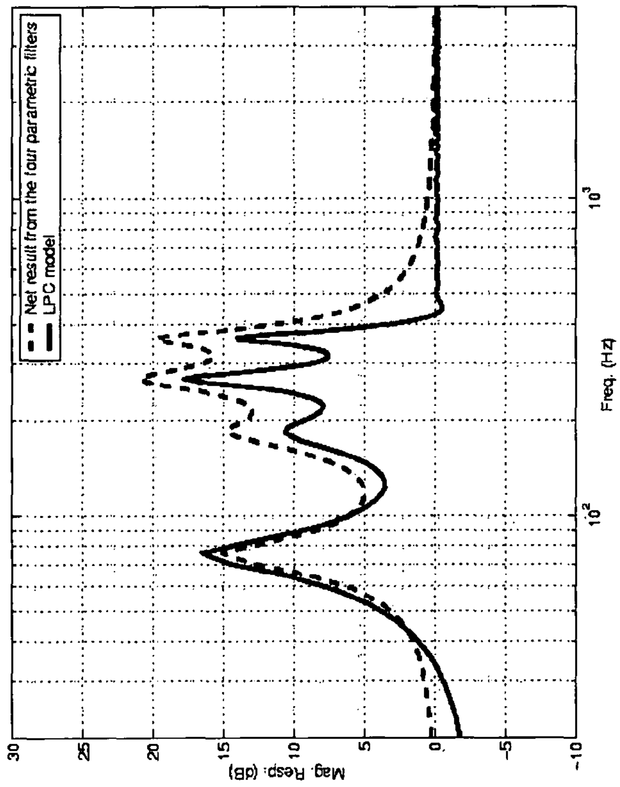
FIG. 8 is a cascaded response according to the present invention.
Figure 7:
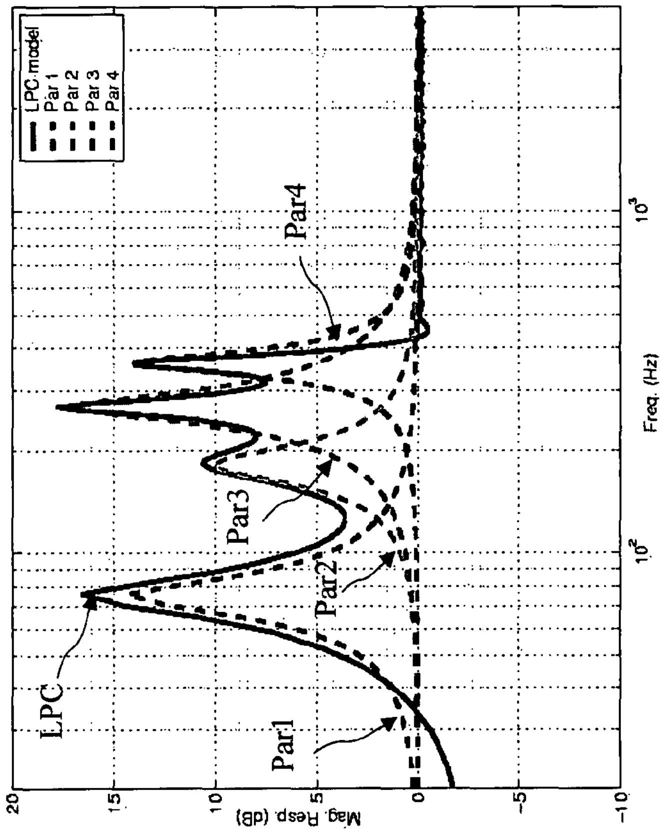
FIG. 7 is an LPC model according to the present invention modeling four peaks.

In the next step the gain, Gi(I=1, 2, 3, and 4) at each of the center frequencies $F_{c1}$, $F_{c2}$, $F_{c3}$, and $F_{c4}$ (or at the corresponding nearest bins from the Fast Fourier Transform (FFT)) is computed. Finally, the two frequency points, for each parametric filter I, corresponding to $G_i/\sqrt{2.5}$ are determined to yield $\hat{Q}_i = f_{ci}/BW_{G^i/\sqrt{2.5}}(f_{ci})$ The resulting parametric filters at each enter frequency is shown in FIG. 7. The resulting cascaded response from the four parametric filters is shown in FIG. 8, wherein the response of each parametric filter, defined by $f_{ci}$, $Q_i$, and $G_i$, is obtained from equations (3).

Due to band interactions between adjacent (cascaded) parametric IIR filters, the resulting frequency response may not match the modeled room frequency response beyond the center frequencies. As a result, the parameter Qi and Gi for each of the parametric IIR filters are annealed (or optimized) from the initial values, independent of each other, such that the errors:

$$E = (1/N)\sum_{k=1}^{N} |H_{LPC}(\omega_k) - H_{f_{ci},Q_iG_i}(\omega_k)|^2$$

are minimized at a finite number of discrete frequency points, N, in the neighborhood of each of the $f_{ci}$'s Typically, the cascaded amplitude response will be greater than the LPC model spectrum and the $\hat{Q}_i$ values are gradually increased such that the average error, E, is minimized for each of the three highest $f_{ci}$ parametric filters. Alternatively, a gradient descent scheme may be used to optimize the $\hat{Q}_i$ values.

Figure 9:
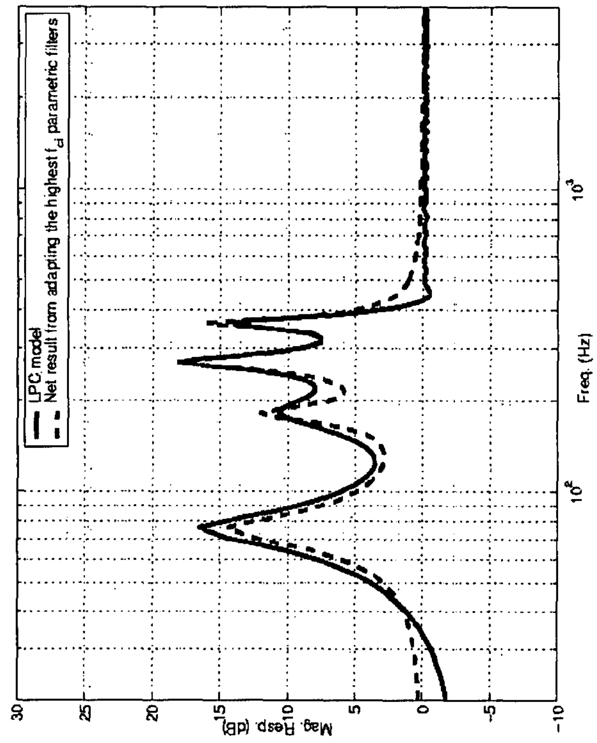
FIG. 9 is a cascaded response including annealing according to the present invention.
Figure 10:
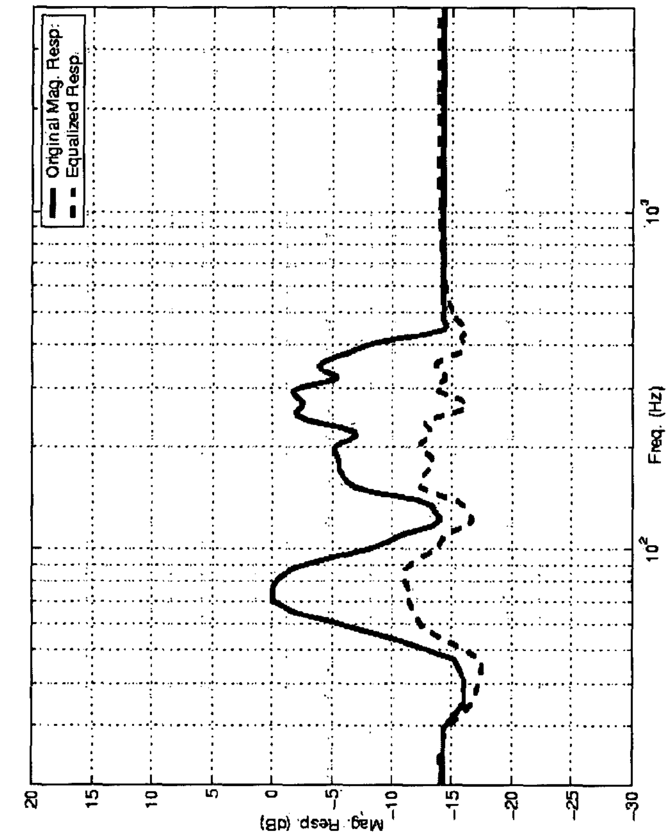
FIG. 10 is a comparison of the original response and the response after equalization according to the present invention.

After annealing (i.e., optimizing), the cascaded response is shown in FIG. 9. Finally, the equalized response is obtained through inversion of the parametric filter cascaded response to obtain an inverse cascade response, multiplying the inverse cascade response with the original room response to obtain a multiplied response, and ⅓-octave smoothing the multiplied response to obtain the equalized response. The equalized response shown in FIG. 10 demonstrates a dramatic improvement in low-frequency equalization. The order of processing described above is included in an alternative method described in FIG. 14B, and a method including inverting the smoothed frequency domain room response and computing the poles and zeros of the equalization filters from the peaks and valleys of the inverted smoothed frequency domain room response is described in FIG. 14A.

Figure 12:
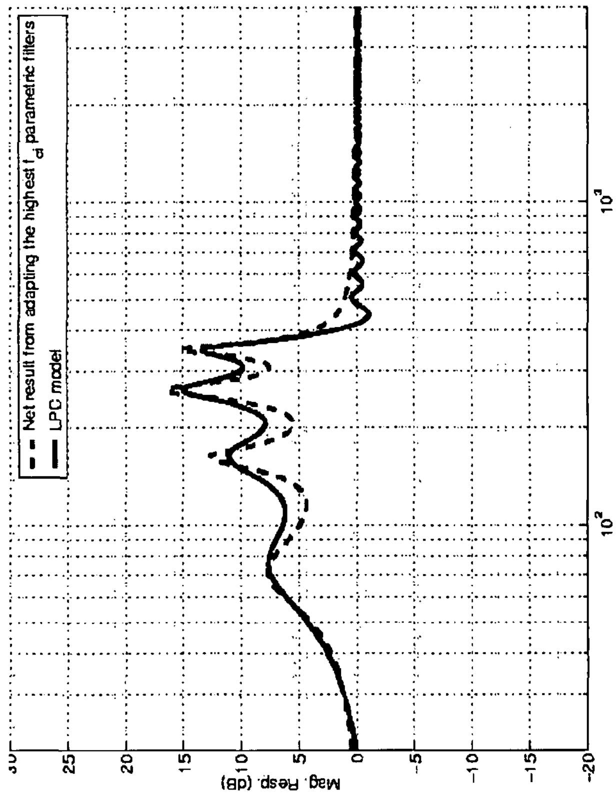
FIG. 12 is a comparison of the LPC model and the annealed cascaded parametric filter response.
Figure 11:
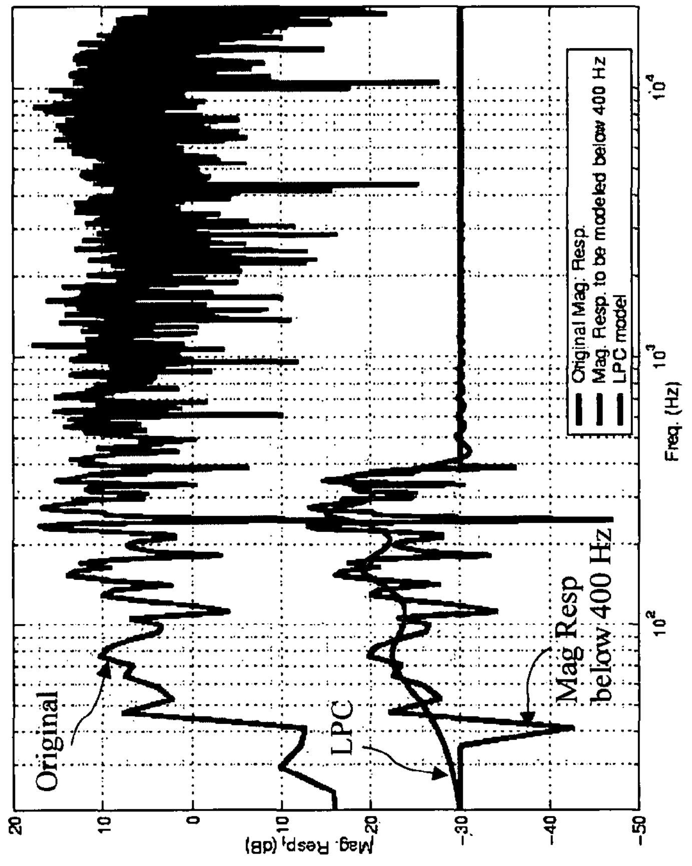
FIG. 11 is a comparison of the original response and the LPC model.
Figure 13:
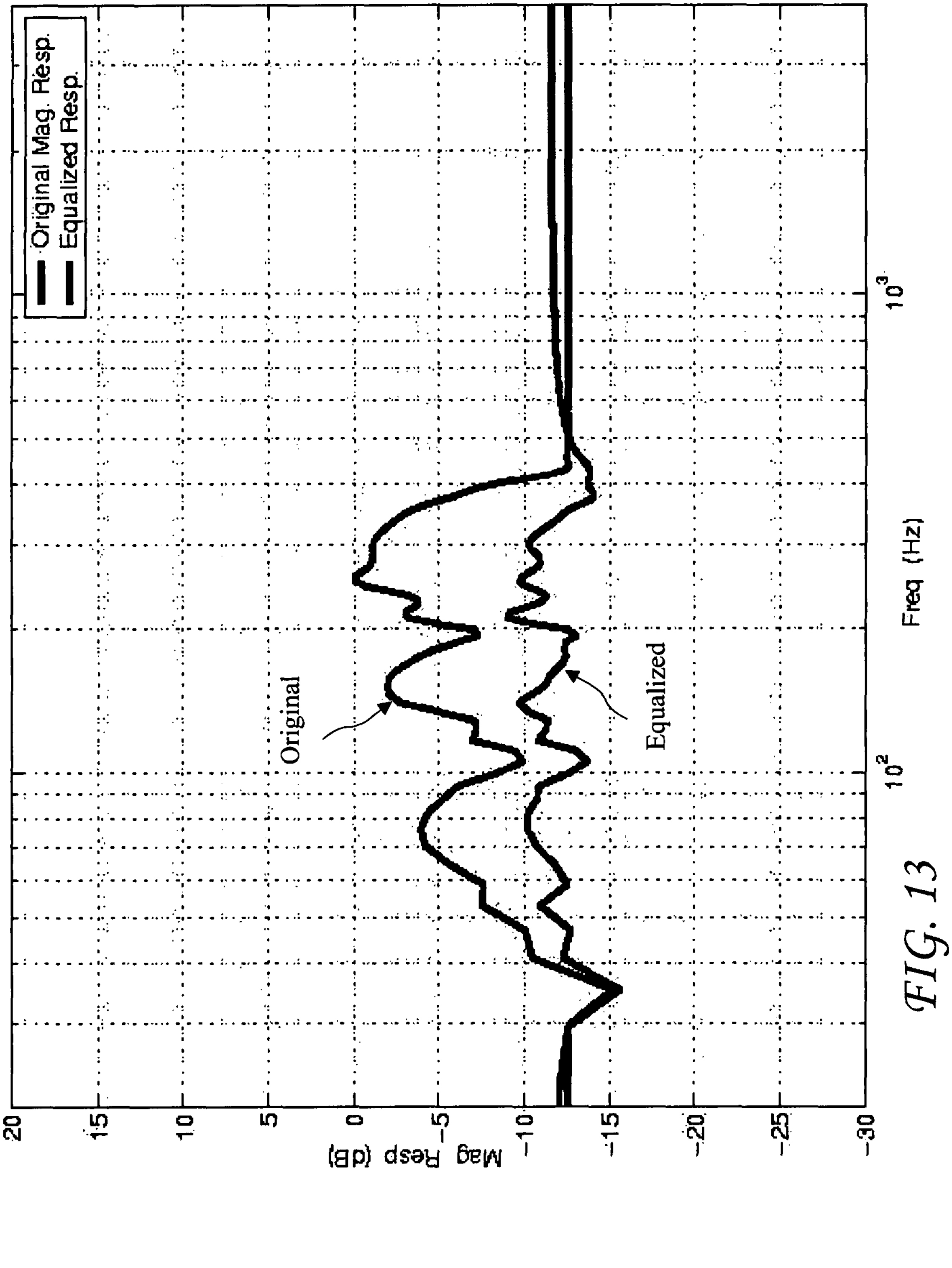
FIG. 13 is original ⅓-octave smoothed response and the equalized response using the methods of the present invention.

Another example of a room response to be modeled below 400 Hz is shown in FIG. 11, along with the LPC model fit (having four poles or roots) below 400 Hz. A DC offset between the curves is purposely introduced to show the LPC fit. The Q-annealed cascaded response with four cascaded parametric IIR filters is shown in FIG. 12 along with the LPC model response. The ⅓-octave smoothed original response and the equalized response is shown in FIG. 13.

Figure 14A:
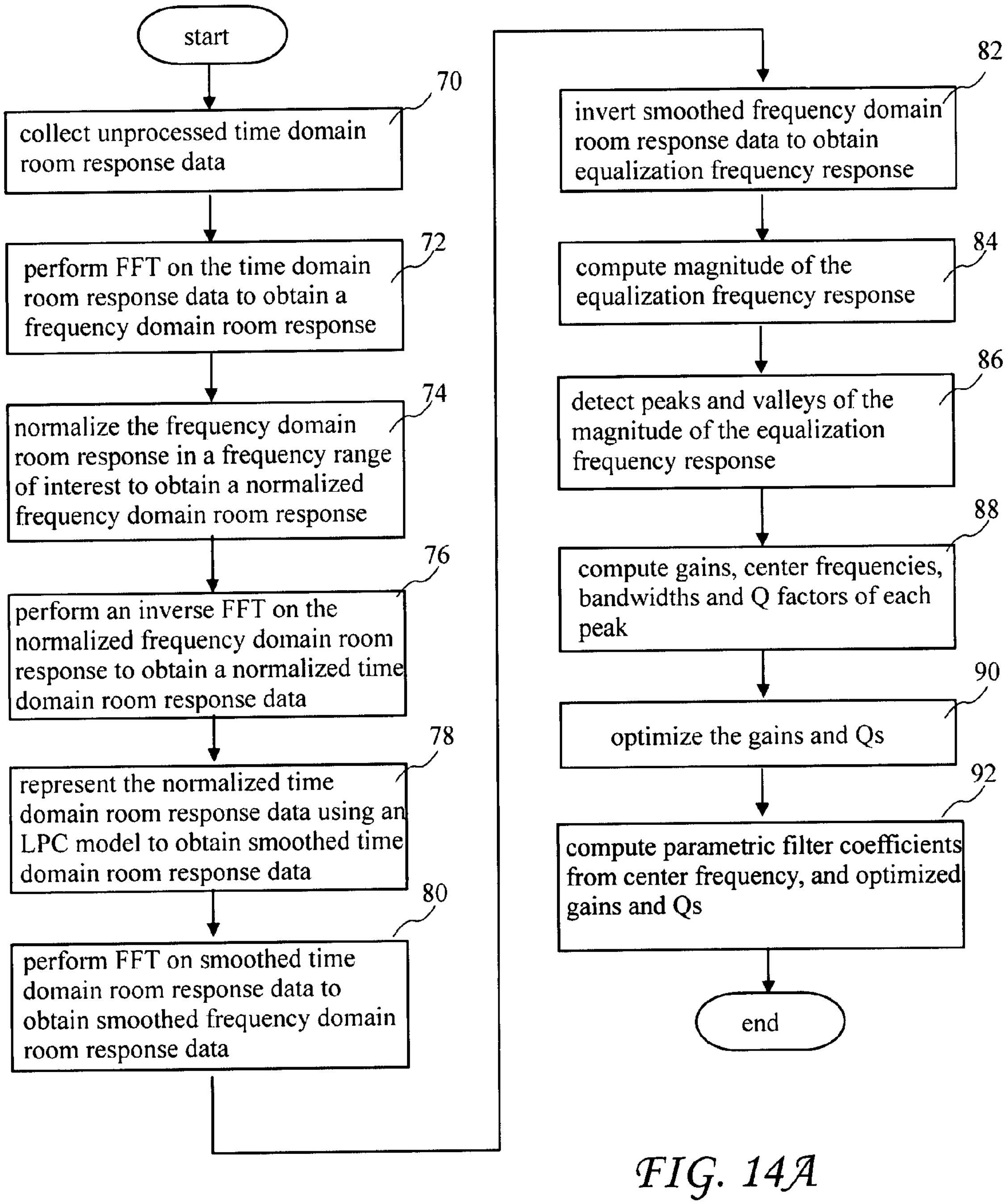
FIG. 14A is a high level diagram of a method according to the present invention.

An overview of a method according to the present invention for computing parameters of cascaded parametric IIR filters is described in FIG. 14A. Unprocessed time domain room response data is collected at step 70. An FFT is performed on the time domain room response data to obtain a frequency domain room response at step 72. The frequency domain room response is normalized in a frequency range of interest to obtain a normalized frequency domain room response at step 74. An inverse FFT is performed on the normalized frequency domain room response to obtain normalized time domain room response data at step 76. The normalized time domain room response data is represented using an LPC model to obtain smoothed time domain room response data at step 78. An FFT is performed on the smoothed time domain room response data to obtain smoothed frequency domain room response data at step 80. The smoothed frequency domain room response data is inverted to obtain equalization frequency response at step 82. The magnitude of the equalization frequency response is computed at step 84. The peaks and valleys of the magnitude of the equalization frequency response are found at step 86. The gains, center frequencies, bandwidths, and Q factors of each peak are computed at step 88. The gains and Q factors are optimized at step 90. The parametric filter coefficients are computed from the center frequency and the optimized gains and Q factors at step 92. Details of steps of detecting the peaks, computing the gains, center frequencies, bandwidths, and Q factors of each peak, and optimizing the gains and Q factors (step 84-90), are described in more detail in FIGS. 15A-17C below.

Figure 14B:
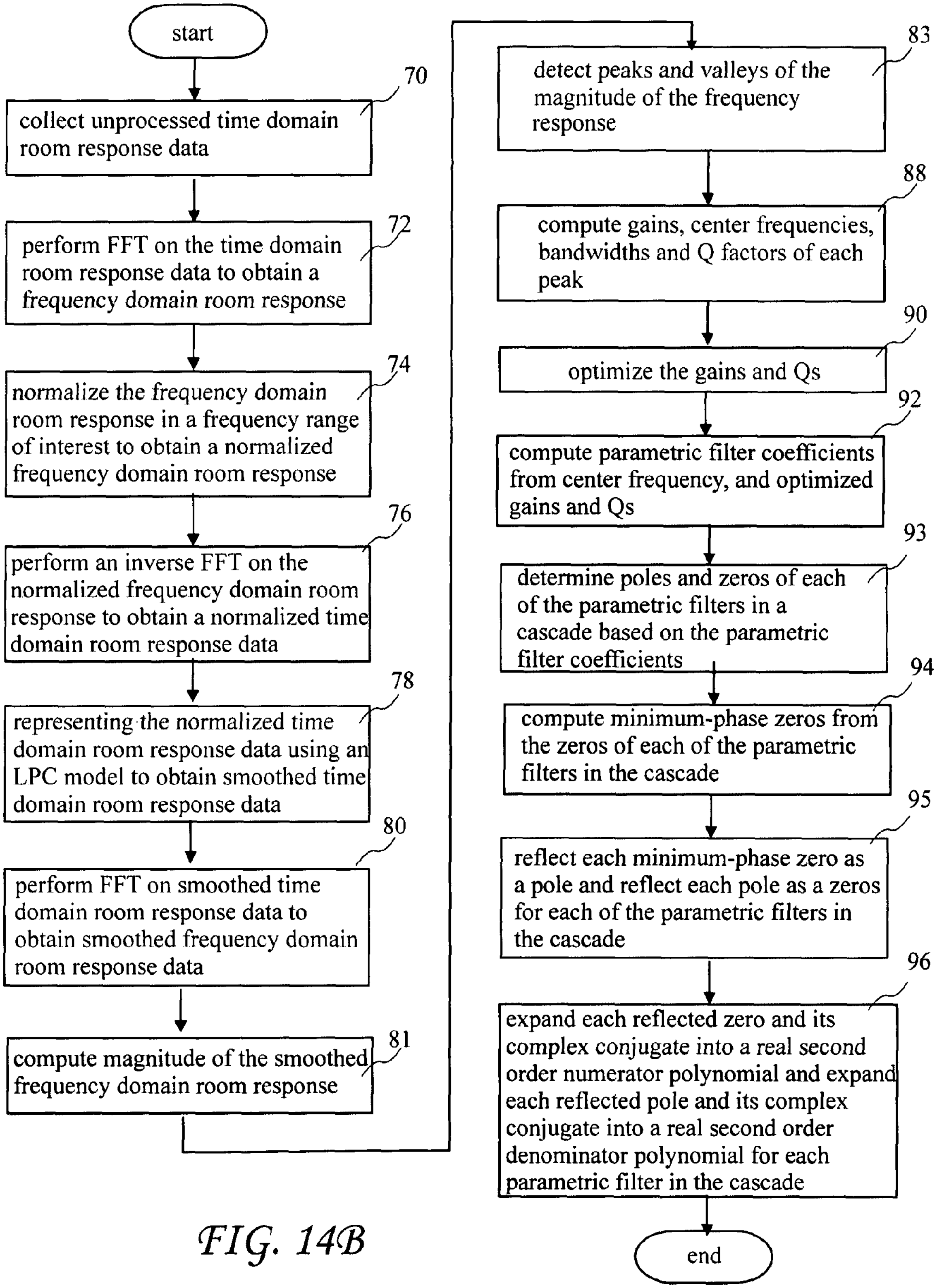
FIG. 14B is a high level diagram of a second embodiment of a method according to the present invention.

A high level diagram of a second embodiment of a method according to the present invention is described in FIG. 14B. The second embodiment does not include the inversion step 82 of FIG. 14A. Step 84 of FIG. 14A is replaced by compute magnitude of the smoothed frequency domain room response in step 81 and step 86 of FIG. 14A has been replaced by detected peaks and valley of the magnitude of the frequency response in step 83. The method of FIG. 14B further includes determine poles and zeros of each of the parametric filters in the cascade in step 93, compute minimum-phase zeros from the zeros of each of the parametric filters in the cascade in step 94, reflect each minimum-phase zero as a pole and reflect each pole as a zeros for each of the parametric filters in the cascade in step 95, and expand each reflected zero and its complex conjugate into a real second order numerator polynomial and expand each reflected pole and its complex conjugate into a real second order denominator polynomial for each parametric filter in the cascade in step 96.

Figure 14C:
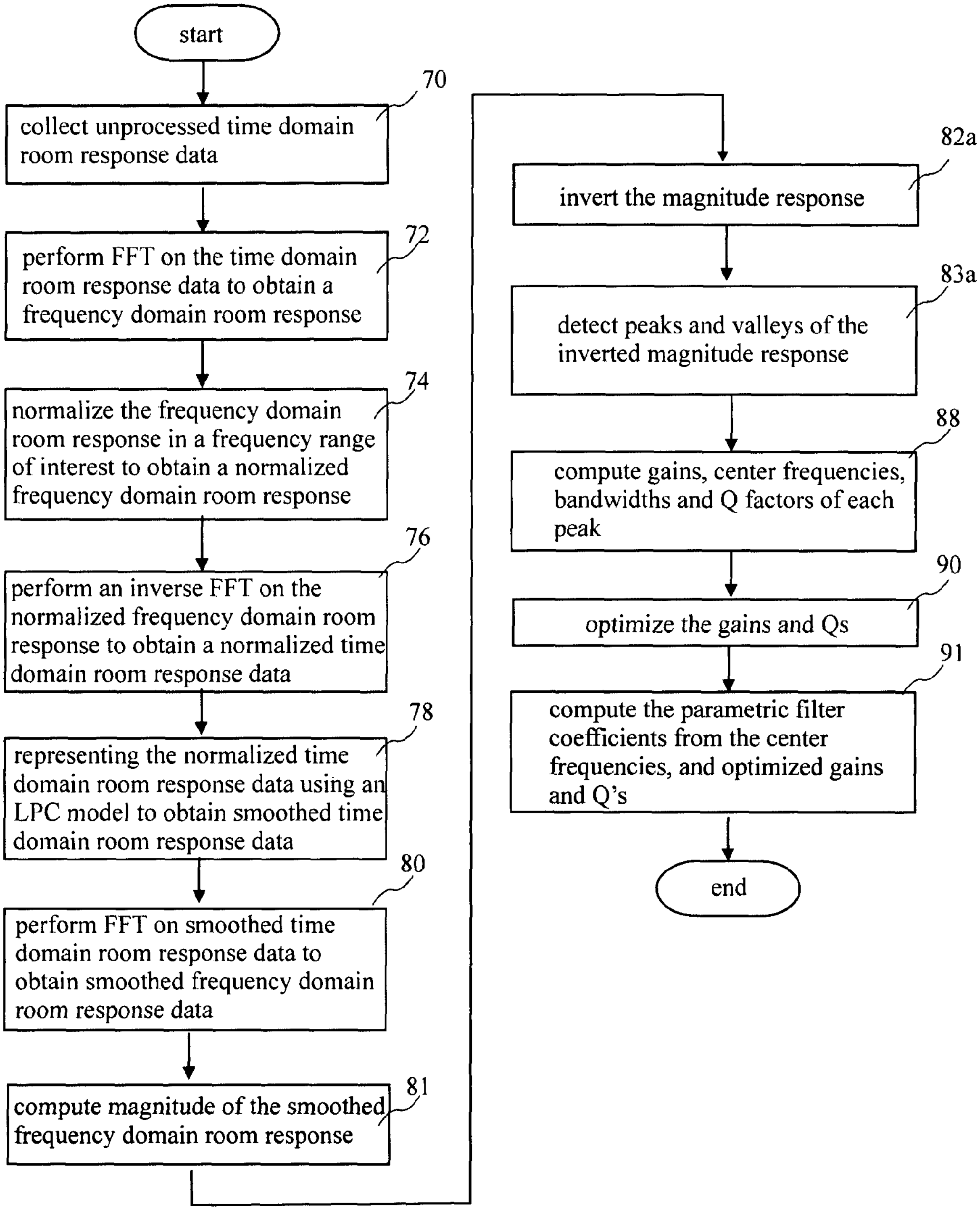
FIG. 14C is a high level diagram of a third embodiment of a method according to the present invention.

A high level diagram of a third embodiment of a method according to the present invention is described in FIG. 14C. The third embodiment is very similar to the second embodiment (see FIG. 14B) with the difference being that step 83 of the second method is replaced by inverting the magnitude response at step 82*a* and detecting peaks and valleys of the magnitude of the inverted magnitude response at step 83*a*, and step 92 of the second method is replaced by compute the parametric filter coefficients from the center frequencies and optimized gains and optimized Q's at step 91. Further, steps 93, 94, 95, and 96 of the second method (see FIG. 14B) are eliminated in the third method.

Figure 15A:
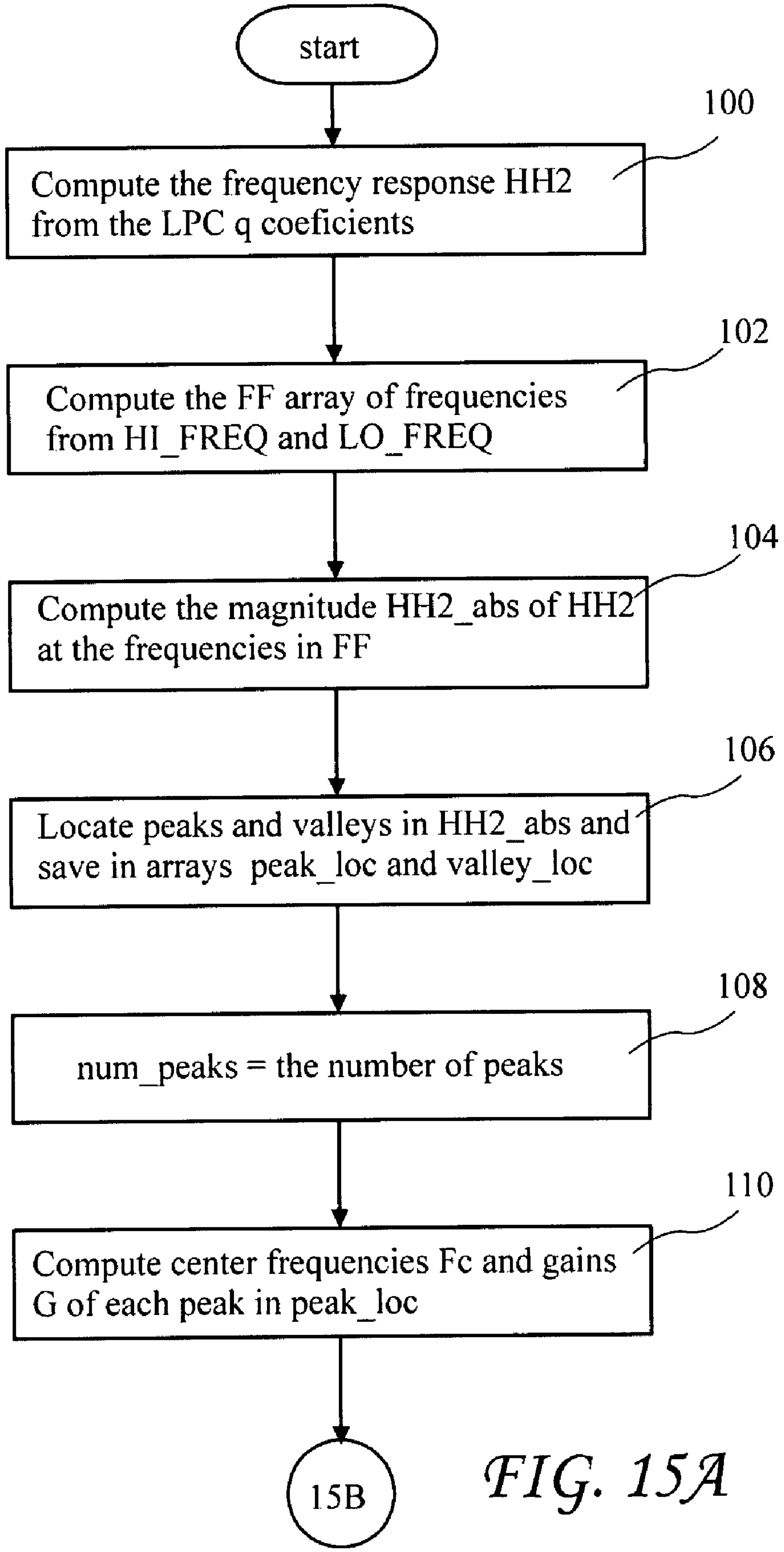
FIG. 15A is a first part of a method for computing a Q factor.

A detailed method for computing the parameters of the parametric IIR filters from the coefficients of the LPC model is described in FIGS. 15A-17C. FIGS. 15A-15C describe computing the Q factors. Computing a frequency response HH2 from a linear predication coefficient q is described in Step 100 where the elements in HH2 correspond to frequencies in FF, an array of frequencies. Given an interested frequency range between LOFREQ and HIFREQ in Hz, the low bin bin_lo and high bin, bin_hi and update frequency FF array are computed such that the elements of FF are the frequencies in the interested frequency range, is described in step 102. HH2_abs, the magnitude of HH2, based on the bin_lo and bin_h are computed in the interested frequency range at step 104. The peak locations peak_loc and valley_locations valley_loc are determined while ensuring that the first peak occurs before the first valley at step 106. The number of peaks is saved as num_peaks at step 108. The center frequency Fc and gain G of each peak based on the peak location peak_loc and the magnitude of frequency response HH2_abs are computed at step 110.

Figure 15B:
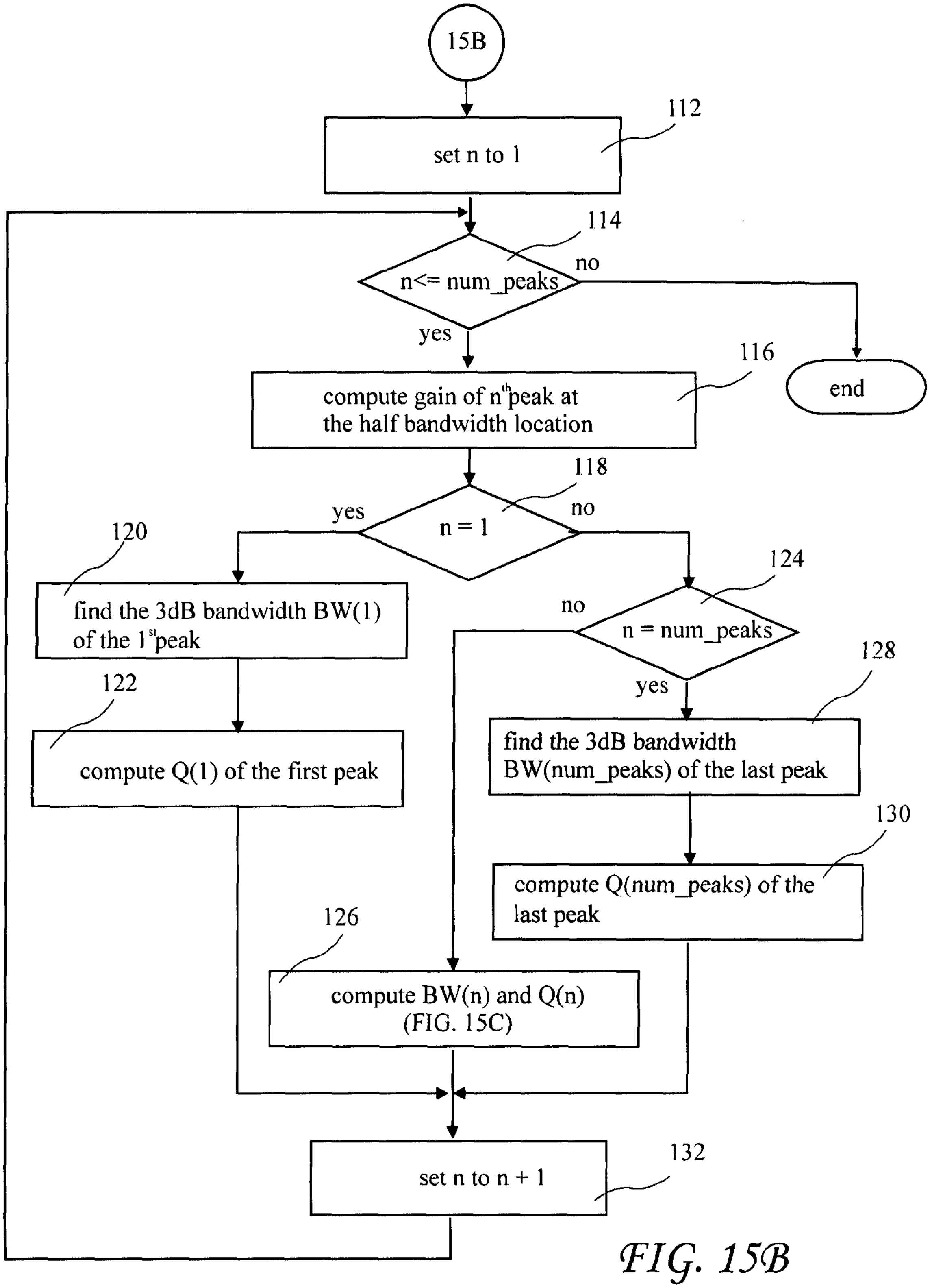
FIG. 15B is a second part of the method for computing the Q factor.

Continuing the Q factor computation with FIG. 15B, a counter n is set to to 1 at step 112 and n is compared to num_peaks at step 114. While n is less than or equal to num_peaks, the gain in dB is computed at the half bandwidth location for the nth peak at step 116. When n is equal to 1, the 3 dB bandwidth BW(1) of the first peak is found at step 120, and Q(1) of the first peak is computed from the first bandwidth BW(1) and the first center frequency Fc (1) at step 122. When n is not equal to 1, if n is less than num_peaks, the 3 dB bandwidth BW(n) and Q(n) are computed (see FIG. 15C). When n is not equal to 1, if n is equal to num_peak the 3 dB bandwidth BW(num_peaks) of the last peak is computed at step 126 and the last Q factor Q(num_peaks) is computed from the last bandwidth BW(num_peaks) and the last center frequency Fc(num_peaks). In all cases, n is incremented by 1.

Figure 15C:
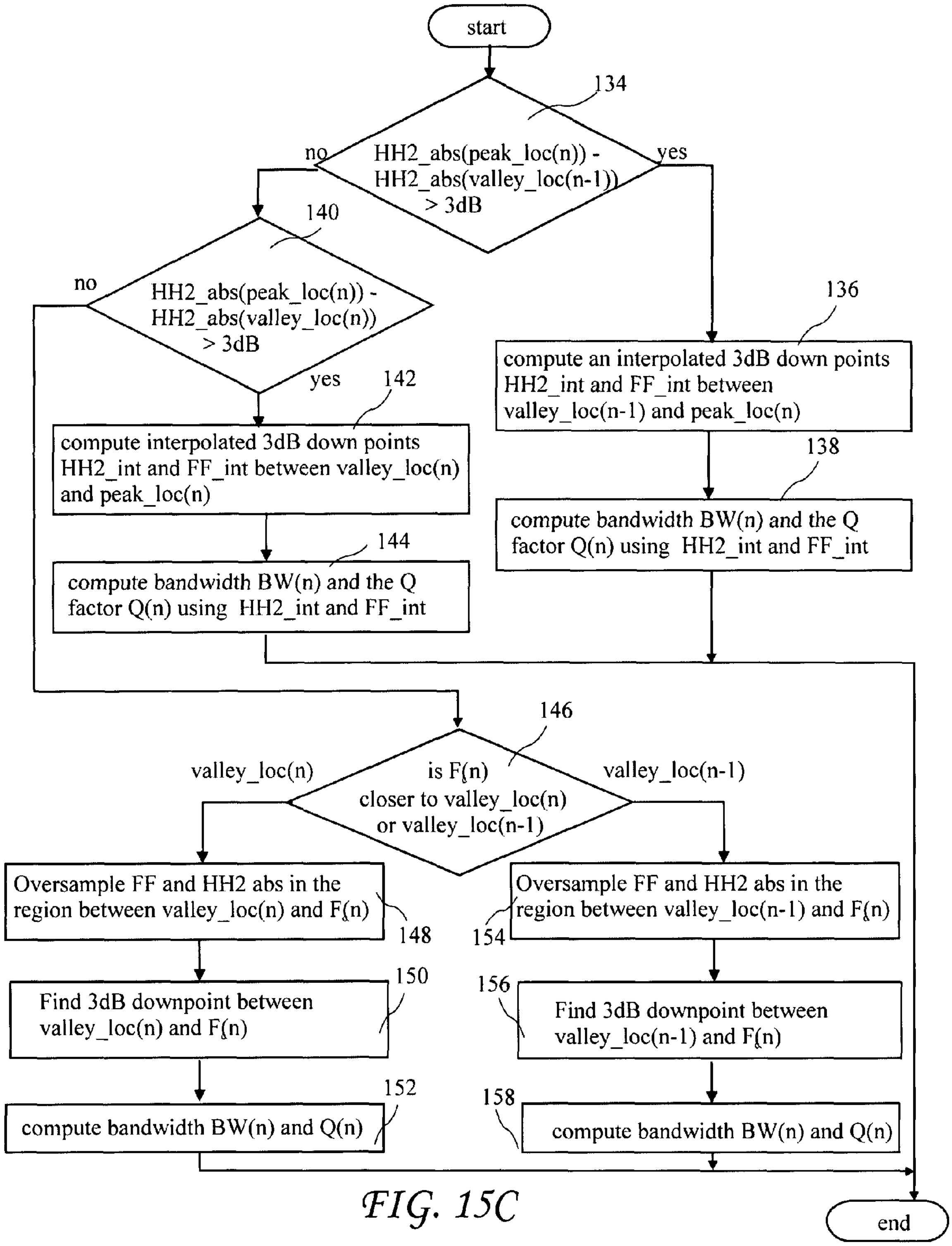
FIG. 15C is a third part of the method for computing the Q factor.

The calculation of the bandwidth and Q factor for n equal to 2 through num_peaks-1 is described in FIG. 15C by the following steps. If the HH2_abs(peak_loc(n)) minus HH2_abs(valley_loc(n−1)) is greater than 3 dB at step 134, compute the interpolated 3 dB down points HH2_int and FF_int between valley_loc(n−1) and peak_loc(n) at step 136 and compute the bandwidth BW(n) and the Q factor Q(n) using HH2_int and FF_int at step 138.

Continuing with FIG. 15C, if the HH2_abs(peak_loc(n)) minus HH2_abs(valley_loc(n−1)) is not greater than 3 dB at step 134, and if the HH2_abs(peak_loc(n)) minus HH2_abs (valley_loc(n)) is greater than 3 dB at step 140, compute the interpolated 3 dB down points HH2_int and FF_int between valley_loc(n) and peak_loc(n) at step 142 and compute the bandwidth BW(n) and the Q factor Q(n) using HH2_int and FF_int at step 144.

Still continuing with FIG. 15C, if the HH2_abs(peak_loc (n)) minus HH2_abs(valley_loc(n−1)) is not greater than 3 dB at step 134, and if the HH2_abs(peak_loc(n)) minus HH2_abs(valley_loc(n)) is not greater than 3 dB at step 140, and if the nth center frequency Fc(n) is closer to the valley_loc (n) than to the valley_loc(n−1) at step 146, oversampling FF and HH2_abs (e.g., by interpolating) in the region between the valley_loc(n) and Fc(n) at step 148, finding the 3 dB downpoint between valley_loc(n) and Fc(n) at step 150, and computing the bandwidth BW(n) and Q(n) at the 3 dB downpoint at step 152.

Completing the computation of Q in FIG. 15C, if the nth center frequency Fc(n) is closer to the valley_loc(n−1) than to the valley_loc(n) at step 146, oversampling FF and HH2_abs (e.g., by interpolating) in the region between the valley_loc (n−1) and Fc(n) at step 154, finding the 3 dB down point between valley_loc(n−1) and Fc(n) at step 156, and computing the bandwidth BW(n) and Q(n) at the 3 dB down point at step 158.

Figure 16A:
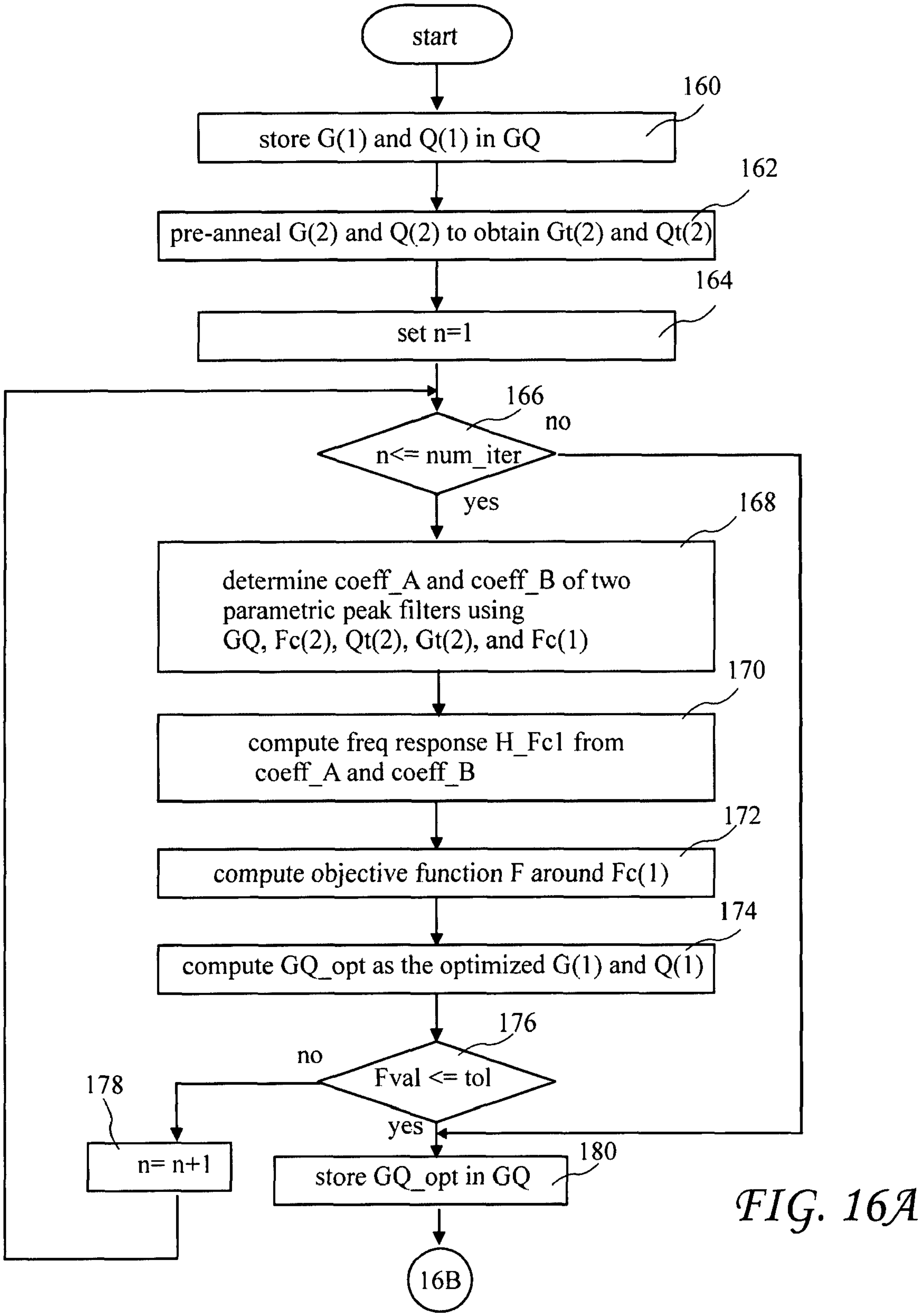
FIG. 16A is a method for optimizing gain and the Q factor for a first peak.
Figure 16B:
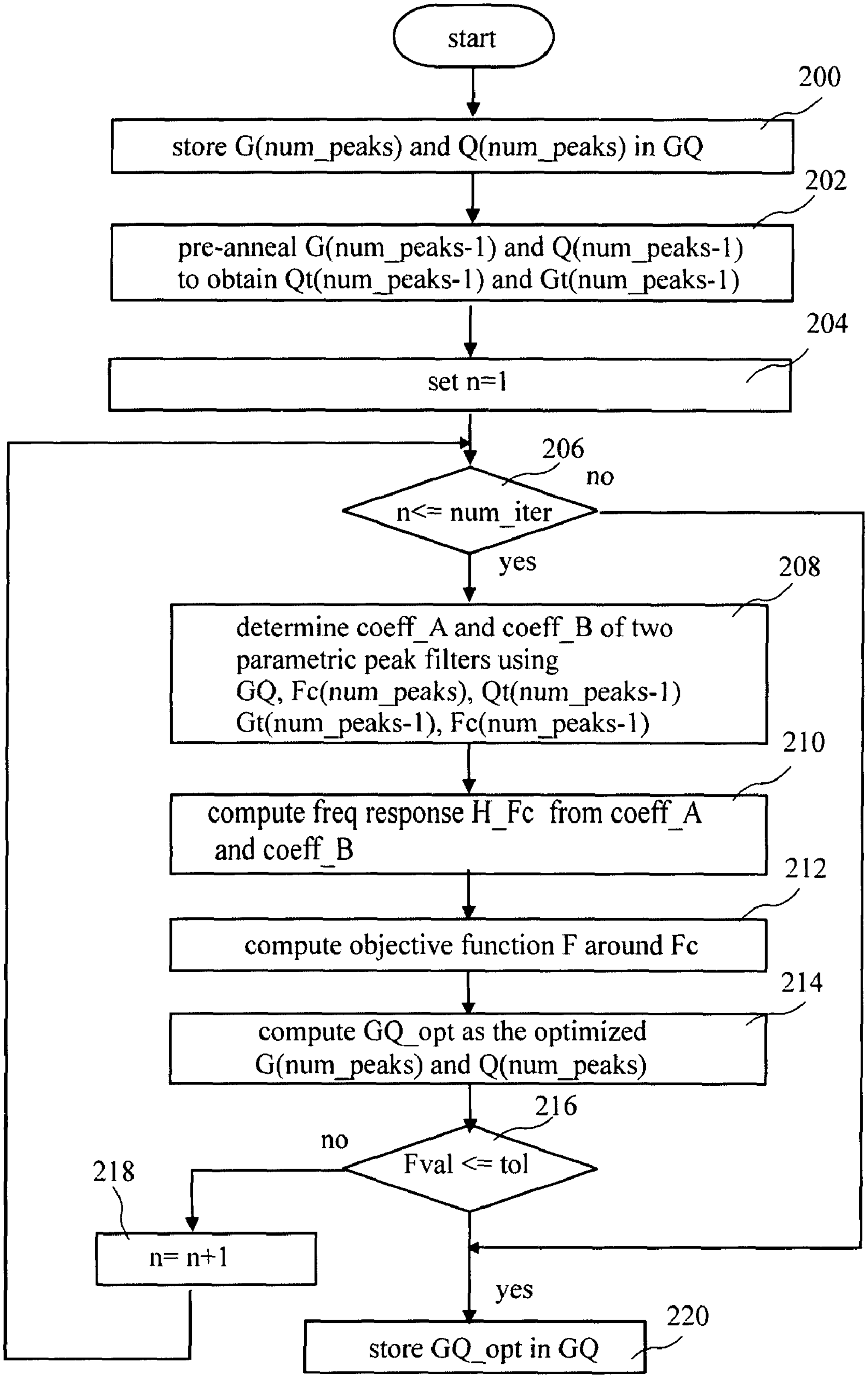
FIG. 16B is a method for optimizing gain and the Q factor for a last peak.
Figure 16C:
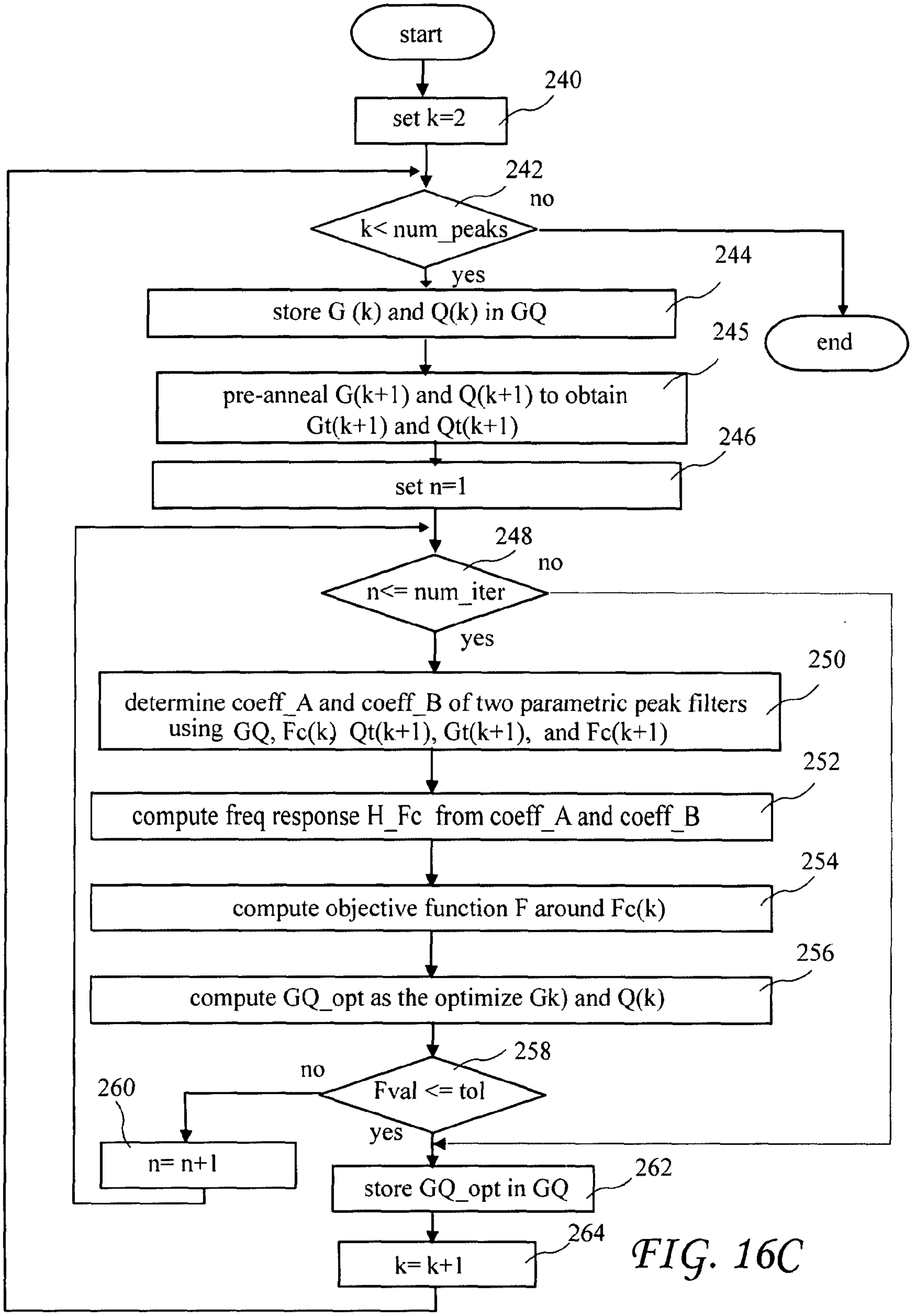
FIG. 16C is a method for optimizing gain and the Q factor for peaks between the first peak and the last peak.

Gain G and Q factor Q optimization is described in FIGS. 16A-16C. FIG. 16A describes a method for optimizing the G(1) and Q(1) corresponding to the first peak. The method includes storing G(1) and Q(1) to be optimized in an array GQ at step 160 and pre-annealing G(2) and Q(2) corresponding the second peak to obtain Qt(2) and Gt(2) at step 162. Pre-annealing may, for example, comprise massaging G and Q according to a rule for a short duration (i.e., for a few samples of the integer "n" or for a corresponding period of time) to improve an approximation of the LPC transfer function. An equation such as G=g*(0.9)^(n) where n=0, 1, . . . may be solved until the match between the parametric filter response, and the LPC spectrum in the region where the parametric filter operates, is reasonably good.

Continuing with FIG. 16A, a counter n is set to 1 at step 164 and n is compared to num_iter at step 166. If n is less than or equal to num_iter, determining and storing coefficients coeff_A (the denominator) and coeff_B (the numerator) of the first parametric filter using GQ, center frequency Fc(1) of the first peak, and using Qt(2), Gt(2), and Fc(2) (see equations 2 and 3 above) of the second peak at step 168. Compute the frequency response H_Fc1 of the first parametric IIR filter at step 170. Compute the objective function F at the frequencies around the center frequency Fc(1) at step 172, where the objective function F is the squared error between the magnitude response of the cascaded parametric filter response and the PLC spectrum. Optimize the G(1) and Q(1) using the objective function F (See FIG. 17A-17C) and save as GQ_opt at step 174. Check if the objective function F value Fval is smaller than the predefined tolerance tol at step 176. If Fval is less than or equal to tol, store GQ_opt (the optimized G(1) and Q(1)) in the GQ array at step 180 as the optimized G(1) and Q(1) for the first filter. If Fval is greater than to tol, increment n at step 178 and go to step 166 above using GQ_opt (the optimized G(1) and Q(1)) in place of the initial of G(1) and Q(1)) in steps 168-174. The convergence of GQ is preferably controlled using the Matlab® program fminunc function, available from MATHWORKS in Nitick, Mass.

FIG. 16B describes a method for optimizing the G(k) and Q(k) corresponding the last peak (i.e., k=num_peaks). The method includes storing the G(num_peaks) and Q(num_peaks) to be optimized in an array GQ at step 200 and pre-annealing G(G(num_peaks) and Q(num_peaks)−1) and Q(G (num_peaks) and Q(num_peaks)−2) corresponding the second peak to obtain Qt(G(num_peaks) and Q(num_ peaks)−1) and Gt(G(num_peaks) and Q(num_peaks)−1) at step 202. The counter n is set to 1 at step 204 and n is compared to num_Iter at step 206. If n is less than or equal to num_Iter, determine and store coefficients coeff_A and coeff_B of two parametric filters using GQ, center frequency Fc(num_peaks) of the last peak, and using Qt(num_peaks−1), Gt(num_ peaks−1), and Fc(num_peaks−1) of the peak before the last peak at step 208. Compute the frequency response H_Fc1 of these two filters at step 210. Compute the objective function F at the frequencies around the center frequency Fc of the last peak at step 212. Optimize G(num_peaks) and Q(num_peaks) using the objective function F (See FIG. 17A-17C) to obtain GQ_opt at step 214. Check if the objective function value Fval is smaller than the predefined tolerance tol at step 216. If Fval is less than or equal to tol, store GQ_opt (the optimized G(num_peaks) and Q(num_peaks)) in the GQ array as the optimized G and Q for the last filter at step 220. If Fval is greater than to tol, increment n at step 218 and to go step 206 using GQ_opt (the optimized G(num_peaks) and Q(num_peaks)) in place of the initial G(num_peaks) and Q(num_peaks)) in steps 208-216.

FIG. 16C describes a method for optimizing the G(k) and Q(k) corresponding to the peaks between the first peak and the last peak. The index k is set 2 at step 240. The counter k is compared to num_peaks at step 242. While k is less than num_peaks, the G(k) and Q(k) to be optimized are stored in the array GQ at step 244, G(k+1) and Q(k+1) are pre-annealed at step 245, and the counter n is set to 1 at step 246. n is compared to num_iter at step 248. If n is less than or equal to num_iter at step 248, the coefficients coeff_A and coeff_B for the kth filter are determined using GQ, Fc(k), Qt(k+1), Gt(k+1), and Fc(k+1) and stored, and at step 250. Next, compute the frequency response H_Fc1 from coeff_A and Coeff_B at step 252 and compute the objective function F at the frequencies around the center frequency Fc (k) at step 254. Optimize the G(k) and Q(k) using the objective function F (See FIG. 17A-17C) to obtain GQ_opt at step 256. Check if the objective function value Fval is smaller than the predefined tolerance tol at step 258. If Fval is less than or equal to tol, store GQ_opt (the optmized G(k) and Q(k) in the GQ array at step 262 as the optimized G and Q for the kth filter. If Fval is greater than to tol, increment n at step 260 and to go step 248 using GQ_opt (the optimized G(k) and Q(k)) in place of the initial G(k) and Q(k) in steps 250-256.

Figure 17A:
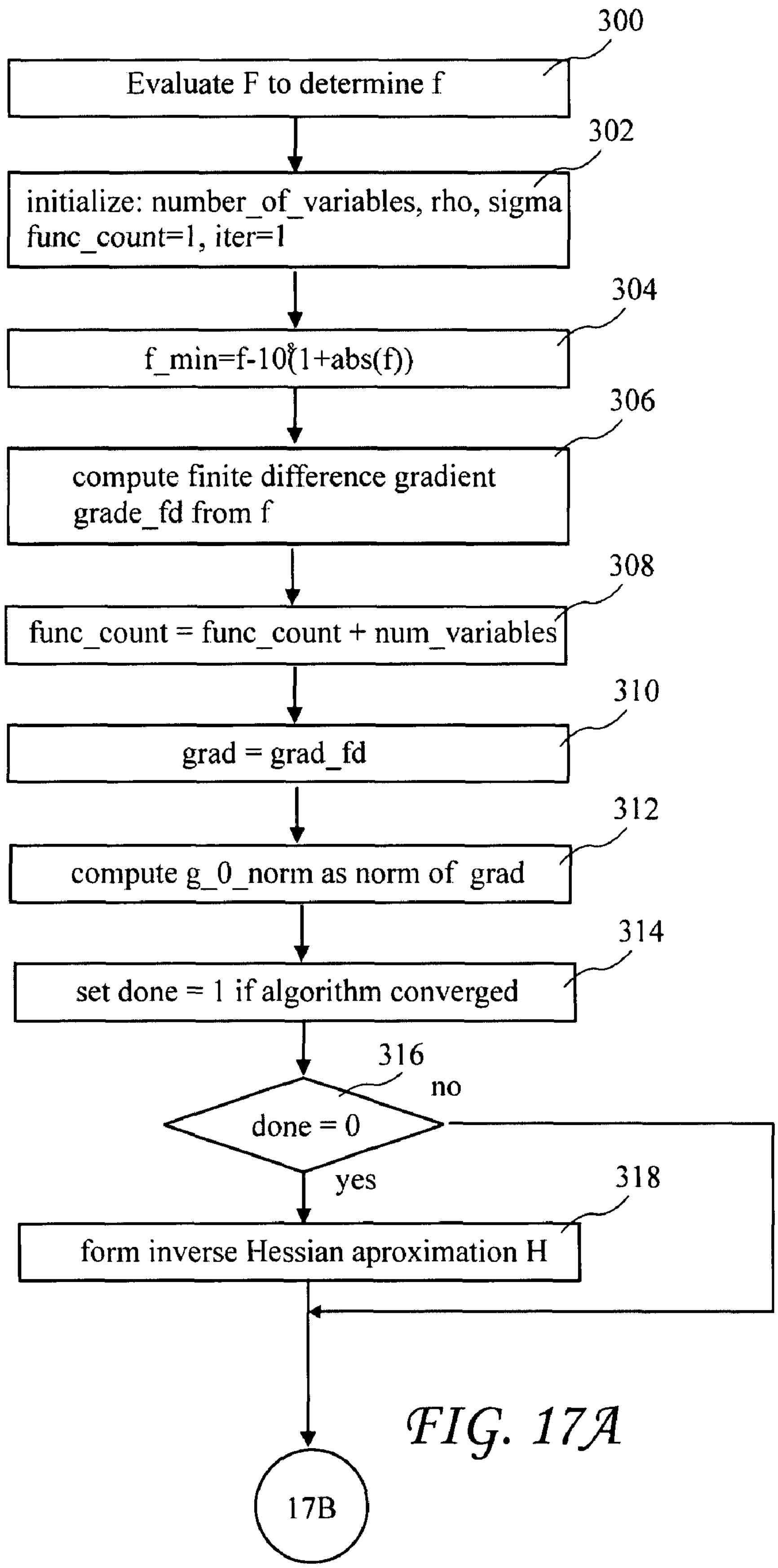
FIG. 17A is a first part of a detailed optimization method.
Figure 17B:
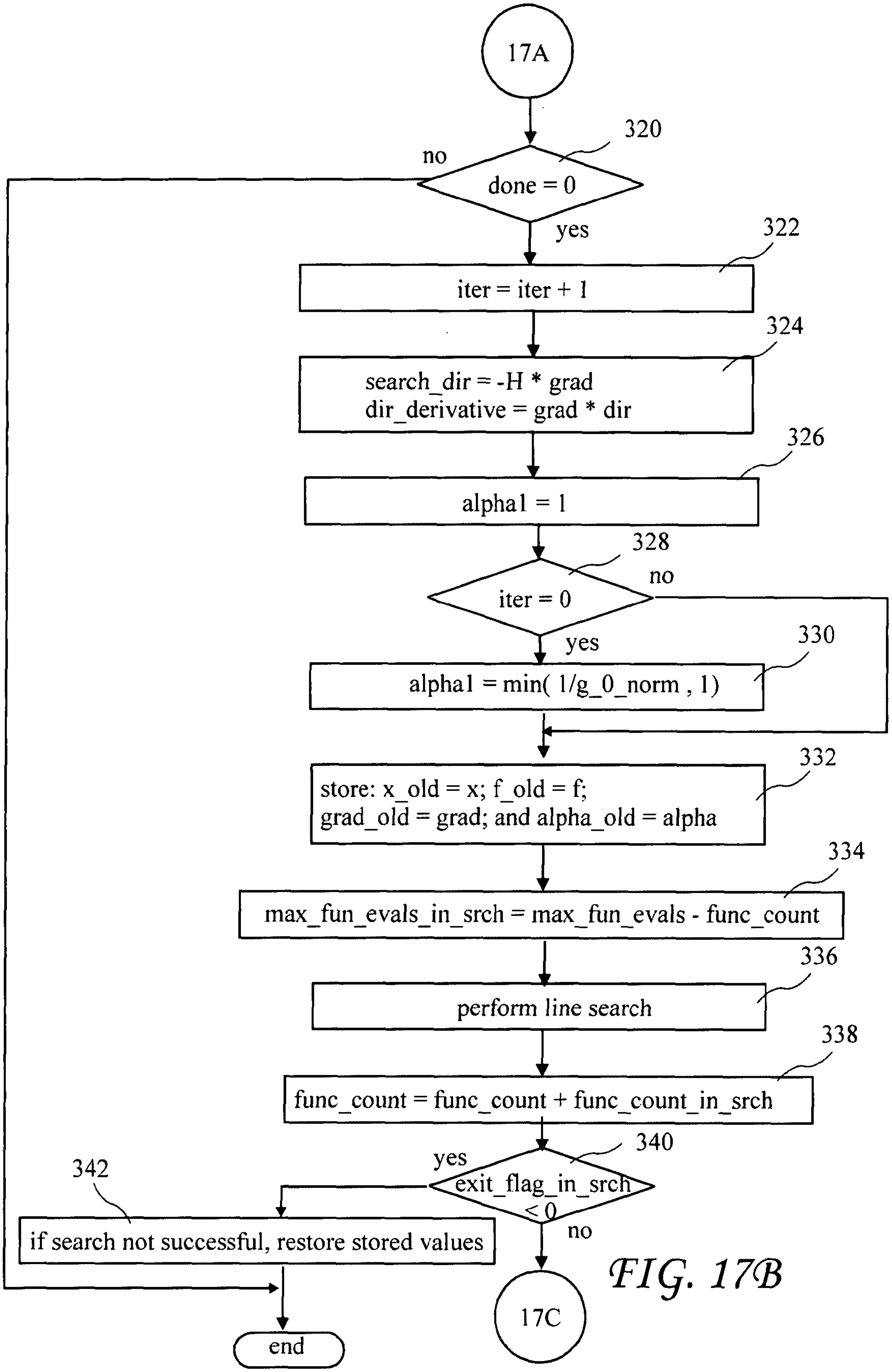
FIG. 17B is a second part of the detailed optimization method.
Figure 17C:
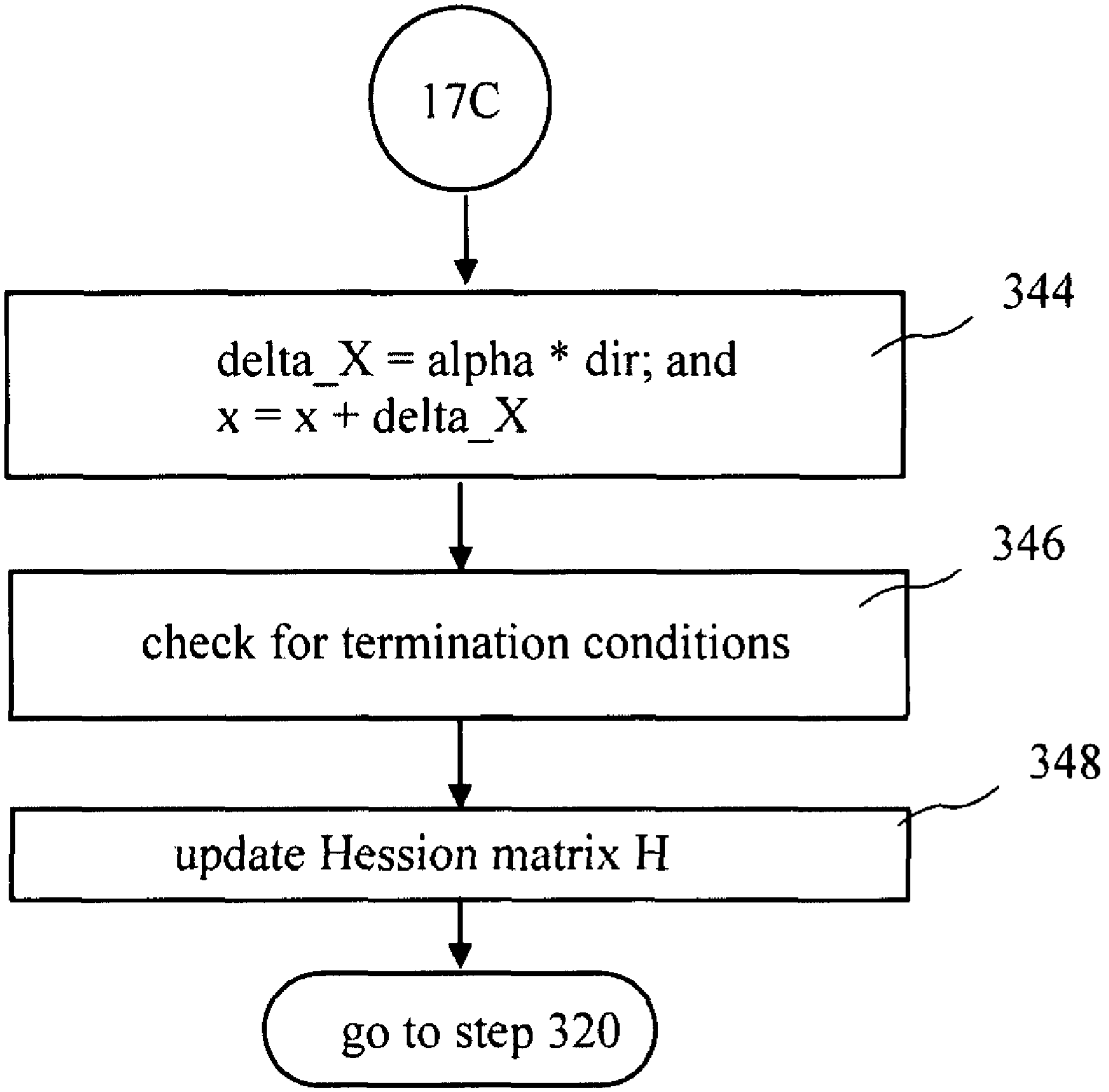
FIG. 17C is a third part of the detailed optimization method.

A method for performing a detailed optimization is described in FIGS. 17A-17C. The objective function F is evaluated to determine the frequency response f of a parametric IIR filter to be optimized at step 300 and number_of_variables, rho, sigma (rho and sigma are well known linesearch parameters) are initialized, and func_count and iter are set to 1 at step 302. f_min is computed as f−$10^8$ (1+abs(f) at step 304. The finite difference gradient grad_fd is computed from f at step 306. Set func_count to funct_count plus num_variables at step 308 (func_count and num_variables are initialized to 1 and 2 respectively), and set grad to grad_fd at step 310. Compute g__0_norm as the norm of grad at step 312 and set done to 1 if the algorithm has converged at step 314. Test done at step 316, and if done has not been set to 1, form the inverse Hessian H at step 318, and then in any case, continue to FIG. 17B.

Continuing with the detailed optimization in FIG. 17B, compare done to 0 in step 320. If done is 1, the optimization is complete. If done is 0, increment iter at step 322 and form a search direction dir and its derivative as follows. Set search_dir to −H times grad, and dir_derivative to grad times dir at step 324. Set alpha1 to 1 at step 326. Compare iter to 0 at step 328, and if iter is 0, set alpha1 to the minimum of 1 divided by g__0_norm and 1 at step 330. Store: x_old=x; f_old=f; grad_old=grad; and alpha_old=alpha at step 332. Set max_fun_evals_In_srch to max_fun_evals minus func_count at step 334 perform a line search at step 336, and set func_count to func_count plus func_count_in_search at step 338. Check is exit_flag_in_search has been set at step 340. exit_flag_in_search is a flag showing the search result. exit_flag_in_search is set to 1 if step length alpha for which f(alpha)<fminimum was found. exit_flag_in_search is set to 0 if acceptable step length alpha was found. exit_flag_in_search is set to −1 if maximum function evaluations are reached. exit_flag_in_search is set to −2 if no acceptable point could be found. If exit_flag_in_search is less than 0, restore stored values saved in step 332 and exit at step 342. If exit_flag_in_search has not been set, go to FIG. 17C. Delta_X is set to alpha*dir and x is set to x plus Delta_X in step 344. Check for termination conditions at step 246, update the Hession matrix H at step 348 and go to step 320 in FIG. 17B.

Table 1 describes the variables used above:

TABLE 1

| Variable | Shown in | Description | Dimension |
|---|---|---|---|
| HH2 | 15A | Target frequency response array of cascaded parametric IIR filters | 8192 |
| q | 15A | Smoothed room frequency response | 1025 |
| HI__FREQ | 15A | Upper frequency limit for FF | |
| LO__FREQ | 15A | Lower frequency limit for FF | |
| FF | 15A | | |
| HH2__abs | 15A | Amplitude of HH2 | 8192 |
| peak__loc | 15A | Peak frequency array | <=15 |
| valley__loc | 15A | Valley frequency array | <15 |
| num__peaks | 15A | Number of peaks | 1 |
| GQ | 16A | Optimized G and Q for a peak | 2 by N |
| Fc | 15A, 15C | Center frequency array | <=15 |
| G | 15A, 15B | Gain array | <=15 |
| BW | 15B, 15C | Bandwidth array | <=15 |
| Q | 15B, 15C | Q factor array | <=15 |
| Qt | 16B | Annealed Q factor array | <=15 |
| Gt | 16B | Annealed gain array | <=15 |
| HH2__int | 15C | Interpolated HH2__abs around a peak | 21 |
| FF__int | 15C | Interpolated frequencies around a peak | 21 |
| H__Fc | 16A | Frequency response of cascaded parametric IIR filters | 6 by 8192 |
| coeff__A | 16A | Denominator array of cascaded parametric IIR filter coefficients | 6 by num__peaks |
| coeff__B | 16A | Numerator array of cascaded parametric IIR filter coefficients | 6 by num__peaks |
| Fval | 16A | Value of objective function | 1 |
| tol | 16A | tolerance (approx 0.01) | 1 |

TABLE 1-continued

| Variable | Shown in | Description | Dimension |
|---|---|---|---|
| num__iter | 16A | Number of iterations (10 to 100) | 1 |
| rho | 17A | Constant used for line search | 1 |
| sigma | 17A | Constant used for line search | 1 |
| func__count | 17A | Number of times a function evaluated | 1 |
| iter | 17A | Number of iteration | 1 |
| f__min | 17A | values of the function | 1 |
| grad__fd | 17A | gradient | 2 |
| g__0__norm | 17A | Norm of initial gradient | 1 |
| H | 17A | initial inverse Hessian approximation | 2 by 2 |
| grad | 17B | Same as grad__fd | 2 |
| dir | 17B | search direction | 2 |
| alpha1 | 17B | A constant for line search | 1 |
| alpha | 17B | Step length | 1 |
| max__fun__evals__in__srch | 17B | Maximum number of line search | 1 |
| max__fun__evals | 17B | Maximum number of times a function evaluated | 1 |
| func__count | 17B | Number of times a function evaluated | 1 |
| func__count__in__srch | 17B | number of line search | 1 |
| exit__flag__in__srch | 17B | Line search flag | 1 |
| delta__x | 17C | Array used to update x | 2 |
| x | 17C | Same as GQ | 2 |

A method for modeling the low-frequency room acoustical response using a cascade of parametric filters has been described above. The LPC model is first used to generate an all-pole model of the room response. Subsequently, the roots of the denominator polynomial are determined and used to determine the parameters of the parametric filter. Additional annealing of the Q values permit better modeling of the LPC response and subsequent equalization of the room response. Alternative methods include adapting the Q1 parameters using gradient descent techniques as well as modeling using frequency warping. Results may be extended also for multiple listener applications (viz., multiple positions).

While the invention herein disclosed has been described by means of specific embodiments and applications thereof, numerous modifications and variations could be made thereto by those skilled in the art without departing from the scope of the invention set forth in the claims.

We claim:

1. A method for equalizing audio signals provided to speakers, the method comprising:

measuring loudspeaker-room acoustics to obtain time domain room response data;

processing the time domain room response data with a Linear Predictive Coding (LPC) model to obtain smoothed time domain room response data;

performing an FFT on the smoothed time domain room response data to obtain smoothed frequency domain room response data;

computing center frequency $F_c$, a gain G, a bandwidth BW, and a term Q factor for a plurality of parametric Infinite-duration Impulse Response (IIR) filters from the smoothed frequency domain room response data includes a method for determining a number of peaks num_peaks comprising:

computing a frequency response HH2 from a linear predication coefficient q wherein elements in the frequency response HH2 correspond to an array of frequencies FF;

given an interested frequency range between LO_FREQ and HI_FREQ in Hz, and a low bin bin_lo and a high bin, bin_hi, updating the array of frequencies FF such that the elements of the updated the array of frequencies FF are the frequencies in the interested frequency range;

computing HH2_abs, the magnitude of HH2, based on the bin_lo and bin_hi in the interested frequency range;

determining peak locations peak_loc and valley_locations valley_loc while ensuring that a first peak occurs before a first valley;

saving a number of peak locations as the num_peaks; and determining the center frequency Fc and gain G of each peak based on the peak location peak_loc and the magnitude HH2_abs at the peak location;

cascading the plurality of parametric IIR filters to form an equalizing filter;

equalizing a signal with the equalization filter to obtain an improved loudspeaker-room response; and providing the equalized signal to a speaker to provide improved sound production.

2. The method of claim 1, wherein processing the time domain room response data with an LPC model includes processing the time domain room response data using a Levinson-Durbin recursion.

3. The method of claim 2, wherein processing the time domain room response data with an LPC model comprises processing the time domain room response data with a high-order LPC model.

4. The method of claim 1 further including optimizing the Q term and gain term of each of the plurality of parametric IIR filters.

5. The method of claim 4, wherein optimizing the Q term of each of the plurality of parametric IIR filters includes using a gradient method to optimize the Q term of each of the plurality of parametric IIR filters.

6. The method of claim 1, wherein computing parameters for a plurality of parametric IIR filters comprises computing parameters of a number of parametric filters selected from the group consisting of three and four parametric IIR filters.

7. The method of claim 1, wherein computing the center frequencies $F_c$ comprises computing center frequencies $F_c$ using a root finding technique applied to a polynomial produced by the LPC model.

8. The method of claim 1, further including a method for computing a 3 dB bandwidth BW and the Q for each peak comprising:

setting a counter n to 1;

comparing n to the num_peaks;

while n is less than or equal to the num_peaks, computing a gain in dB at a half bandwidth location for the nth peak;

when n is equal to 1:

finding a 3 dB bandwidth BW(1) of the first peak; and computing the Q(1) of the first peak from the first bandwidth BW(1) and the first center frequency Fc (1);

when n is not equal to 1:

if n is less than the num_peaks, computing the 3 dB bandwidth BW(n) and the Q(n);

if n is equal to num_peak:

compute the 3 dB bandwidth BW(the num_peaks) of the last peak; and compute the last Q factor the Q(the num_peaks) from the last bandwidth BW(the num_peaks) and the last center frequency Fc(the num_peaks).

9. The method of claim 8, wherein a method for computing the 3 dB bandwidth BW(n) and the Q(n) based on HH2_abs, the magnitude of HH2, comprises:

If the HH2_abs(the peak_loc(n)) minus the HH2_abs(the valley_loc(n−1)) is greater than 3 dB:

computing an interpolated 3 dB down points HH2_int and FF_int between the valley_loc(n−1) and the peak_ loc(n); and computing the bandwidth BW(n) and the Q factor the Q(n) using the HH2_int and the FF_int;

if the HH2_abs(the peak_loc(n)) minus the HH2_abs(the valley_loc(n−1)) is not greater than 3 dB, and if the HH2_abs(the peak_loc(n)) minus the HH2_abs(the valley_loc(n)) is greater than 3 dB:

compute the interpolated 3 dB down points HH2_int and FF_int between the valley_loc(n) and the peak_loc (n); and compute the bandwidth BW(n) and the Q factor the Q(n) using the HH2_int and the FF_int;

if the HH2_abs(the peak_loc(n)) minus the HH2_abs(the valley_loc(n−1)) is not greater than 3 dB, and if the HH2_abs(the peak_loc(n)) minus the HH2_abs(the valley_loc(n)) is not greater than 3 dB, and if the nth center frequency Fc(n) is closer to the valley_loc(n) than to the valley_loc(n−1):

oversampling the array of frequencies FF and the HH2_abs in the region between the valley_loc(n) and Center frequency Fc(n);

finding the 3 dB downpoint between the valley_loc(n) and Center frequency Fc(n); and computing the bandwidth BW(n) and the Q(n) at the 3 dB downpoint;

if the nth the center frequency Fc(n) is closer to the valley_loc(n−1) than to the valley_loc(n):

oversampling the array of frequencies FF and the HH2_abs (e.g., by interpolating) in the region between the valley_loc(n−1) and Center frequency Fc(n);

finding the 3 dB down point between the valley_loc(n−1) and the Center frequency Fc(n); and computing the bandwidth BW(n) and the Q(n) at the 3 dB down point.

10. A method for computing coefficients of a family of cascaded parametric IIR filters and using the filters to filter signals provided to speakers, the method comprising:

collecting unprocessed time domain room response data;

performing an FFT on the time domain room response data to obtain a frequency domain room response;

normalizing the frequency domain room response in a frequency range of interest to obtain a normalized frequency domain room response;

performing an inverse FFT on the normalized frequency domain room response to obtain a normalized time domain room response data;

representing the normalized time domain room response data using an LPC model to obtain smoothed time domain room response data;

performing an FFT on the smoothed time domain room response data to obtain smoothed frequency domain room response data;

inverting the smoothed frequency domain room response data to obtain an equalization frequency response;

computing a magnitude of the equalization frequency response;

detecting peaks and valleys of the magnitude of the equalization frequency response;

computing gains G, center frequencies $F_c$, bandwidths BW and bandwidth term Q factors of each of the peaks for a plurality of the parametric Infinite-duration Impulse Response (IIR) filters using a step for determining a number of peaks num_peaks, the step comprising:

computing a frequency response HH2 from a linear predication coefficient q wherein elements in the frequency response HH2 correspond to an array of frequencies FF;

given an interested frequency range between LO_FREQ and HI_FREQ in Hz, and a low bin bin_lo and a high bin, bin_hi, updating the array of frequencies FF such that the elements of the updated array of frequencies FF are frequencies in the interested frequency range;

computing HH2_abs, a magnitude of the frequency response HH2, based on the bin_lo and the bin_hi in the interested frequency range;

determining peak locations peak_loc and valley_locations valley_loc while ensuring that a first peak occurs before a first valley;

saving a number of peak locations as the num_peaks; and determining the center frequency Fc and gain G of each peak based on the peak location peak_loc and the magnitude of the HH2_abs at the peak location;

optimizing the gains and the Q factors;

computing parametric filter coefficients from the optimized gains and the optimized Q factors;

using the parametric filter coefficients to equalize signals; and providing the equalized signals to speakers to provide improved sound production.

11. The method of claim 10, wherein computing the center frequencies $F_c$ comprises computing center frequencies $F_c$ using a root finding technique.

12. The method of claim 10, further including a method for computing a 3 dB bandwidth BW and the Q for each peak comprising:

setting a counter n to 1;

comparing n to the num_peaks;

while n is less than or equal to the num_peaks, computing a gain in dB at a half bandwidth location for the nth peak;

when n is equal to 1:

finding a 3 dB bandwidth BW(1) of the first peak; and computing the Q(1) of the first peak from the first bandwidth BW(1) and the first center frequency Fc (1);

when n is not equal to 1:

if n is less than the num_peaks, computing the 3 dB bandwidth BW(n) and the Q(n);

if n is equal to num_peak:

compute the 3 dB bandwidth BW(the num_peaks) of the last peak; and compute the last Q factor the Q(the num_peaks) from the last bandwidth BW(the num_peaks) and the last center frequency Fc(the num_peaks).

13. The method of claim 12, wherein a method for computing the 3 dB bandwidth BW(n) and the Q(n) based on HH2_abs, the magnitude of HH2, comprises:

If the HH2_abs(the peak_loc(n)) minus the HH2_abs(the valley_loc(n−1)) is greater than 3 dB:

computing an interpolated 3 dB down points HH2_int and FF_int between the valley_loc(n−1) and the peak_ loc(n); and computing the bandwidth BW(n) and the Q factor the Q(n) using the HH2_int and the FF_int;

if the HH2_abs(the peak_loc(n)) minus the HH2_abs(the valley_loc(n−1)) is not greater than 3 dB, and if the HH2_abs(the peak_loc(n)) minus the HH2_abs(the valley_loc(n)) is greater than 3 dB:

compute the interpolated 3 dB down points HH2_int and FF_int between the valley_loc(n) and the peak_loc (n); and compute the bandwidth BW(n) and the Q factor the Q(n) using the HH2_int and the FF_int;

if the HH2_abs(the peak_loc(n)) minus the HH2_abs(the valley_loc(n−1)) is not greater than 3 dB, and if the HH2_abs(the peak_loc(n)) minus the HH2_abs(the valley_loc(n)) is not greater than 3 dB, and if the nth center frequency Fc(n) is closer to the valley_loc(n) than to the valley_loc(n−1):

oversampling the array of frequencies FF and the HH2_abs in the region between the valley_loc(n) and Center frequency Fc(n);

finding the 3 dB downpoint between the valley_loc(n) and Center frequency Fc(n); and computing the bandwidth BW(n) and the Q(n) at the 3 dB downpoint;

if the nth the center frequency Fc(n) is closer to the valley_loc(n−1) than to the valley_loc(n):

oversampling the array of frequencies FF and the HH2_abs (e.g., by interpolating) in the region between the valley_loc(n−1) and Center frequency Fc(n);

finding the 3 dB down point between the valley_loc(n−1) and the Center frequency Fc(n); and computing the bandwidth BW(n) and the Q(n) at the 3 dB down point.

14. A method for computing the coefficients of a family of cascaded parametric IIR filters and using the filters to filter signals provided to speakers, the method comprising:

collecting unprocessed time domain room response data;

performing an FFT on the time domain room response data to obtain a frequency domain room response;

normalizing the frequency domain room response in a frequency range of interest to obtain a normalized frequency domain room response;

performing an inverse FFT on the normalized frequency domain room response to obtain a normalized time domain room response data;

representing the normalized time domain room response data using an LPC model to obtain smoothed time domain room response data;

performing an FFT on the smoothed time domain room response data to obtain smoothed frequency domain room response data;

computing the magnitude of the smoothed frequency domain room response;

detecting peaks and valleys of the magnitude of the smoothed frequency domain room response;

computing gains G, center frequencies $F_c$, bandwidths BW and bandwidth term Q factors of each of the peaks for a plurality of the parametric Infinite-duration Impulse Response (IIR) filters using a step for determining a number of peaks num_peaks, the step comprising:

computing a frequency response HH2 from a linear predication coefficient q wherein elements in the frequency response HH2 correspond to an array of frequencies FF;

given an interested frequency range between LO_FREQ and HI_FREQ in Hz, and a low bin bin_lo and a high bin, bin_hi, updating the array of frequencies FF such that the elements of the updated array of frequencies FF are frequencies in the interested frequency range;

computing HH2_abs, a magnitude of the frequency response HH2, based on the bin_lo and the bin_hi in the interested frequency range;

determining peak locations peak_loc and valley_locations valley_loc while ensuring that a first peak occurs before a first valley;

saving a number of peak locations as the num_peaks; and determining the center frequency Fc and gain G of each peak based on the peak location peak_loc and the magnitude of the HH2_abs at the peak location;

optimizing the gains and the Q factors;

computing parametric filter coefficients from the center frequencies and the optimized gains and the optimized Q factors;

determining poles and zeros of each of the parametric IIR filters in a cascade based on the parametric filter coefficients;

computing minimum-phase zeros from the zeros of each of the parametric filters in the cascade;

reflecting each minimum-phase zero as a reflected pole and reflecting each pole as a reflected zero for each parametric filter in the cascade;

expanding each reflected zero and its complex conjugate into a real second order numerator polynomial and expanding each reflected pole and its complex conjugate into a real second order denominator polynomial for each parametric filter in the cascade;

using the parametric filters to equalize signals; and providing the equalized signals to speakers to provide improved sound production.

15. A method for computing the coefficients of a family of cascaded parametric IIR filters and using the filters to filter signals provided to speakers, the method comprising:

collecting unprocessed time domain room response data;

performing an FFT on the time domain room response data to obtain a frequency domain room response;

normalizing the frequency domain room response in a frequency range of interest to obtain a normalized frequency domain room response;

performing an inverse FFT on the normalized frequency domain room response to obtain a normalized time domain room response data;

representing the normalized time domain room response data using an LPC model to obtain smoothed time domain room response data;

performing an FFT on the smoothed time domain room response data to obtain smoothed frequency domain room response data;

computing the magnitude of the smoothed frequency domain room response to obtain a magnitude response;

inverting the magnitude response;

detecting peaks and valleys of the inverted magnitude response;

computing gains G, center frequencies $F_c$, bandwidths BW and bandwidth term Q factors of each of the peaks for a plurality of the parametric Infinite-duration Impulse Response (IIR) filters using a step for determining a number of peaks num_peaks, the step comprising:

computing a frequency response HH2 from a linear predication coefficient q wherein elements in the frequency response HH2 correspond to an array of frequencies FF;

given an interested frequency range between LO_FREQ and HI_FREQ in Hz, and a low bin bin_lo and a high bin, bin_hi, updating the array of frequencies FF such that the elements of the updated array of frequencies FF are frequencies in the interested frequency range;

computing HH2_abs, a magnitude of the frequency response HH2, based on the bin_lo and the bin_hi in the interested frequency range;

determining peak locations peak_loc and valley_locations valley_loc while ensuring that a first peak occurs before a first valley;

saving a number of peak locations as the num_peaks; and determining the center frequency Fc and gain G of each peak based on the peak location peak_loc and the magnitude of the HH2_abs at the peak location;

optimizing the gains and the Q factors;

computing parametric filter coefficients from the optimized center frequencies, the optimized gains, and the optimized Q factors;

using the parametric filters to equalize signals; and providing the equalized signals to speakers to provide improved sound production.

* * * * *